(12) United States Patent
Zhao et al.

(10) Patent No.: US 7,008,806 B1
(45) Date of Patent: Mar. 7, 2006

(54) MULTI-SUBBAND CRITERION FOR THE DESIGN OF A DOUBLE-BARRIER QUANTUM-WELL INTRINSIC OSCILLATOR

(75) Inventors: Peiji Zhao, Raleigh, NC (US); Dwight Woolard, Raleigh, NC (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 82 days.

(21) Appl. No.: 10/927,654

(22) Filed: Aug. 24, 2004

(51) Int. Cl.
*H01L 21/00* (2006.01)

(52) U.S. Cl. .......................... 438/22; 438/24; 438/47; 438/94; 438/312; 257/14; 257/25; 257/197

(58) Field of Classification Search ................. 438/22, 438/24, 46–48, 93, 94, 312–314; 257/14, 257/21, 25, 184, 197
See application file for complete search history.

(56) References Cited

U.S. PATENT DOCUMENTS

| | | | |
|---|---|---|---|
| 5,432,362 A * | 7/1995 | Lippens et al. ............. | 257/197 |
| 5,446,293 A | 8/1995 | Chu et al. | |
| 5,703,379 A * | 12/1997 | Le Person et al. ........... | 257/21 |
| 5,723,872 A * | 3/1998 | Seabaugh et al. ............ | 257/25 |
| 5,844,253 A | 12/1998 | Kim et al. | |
| 6,057,567 A * | 5/2000 | Bayraktaroglu ............. | 257/197 |
| 6,218,677 B1 * | 4/2001 | Broekaert .................... | 257/22 |

OTHER PUBLICATIONS

Tredicucci, A. et al., "Continuous wave operation of long wavelength (λ ≡ 11μm) inter-miniband lasers," Electronics Letters, vol. 36, No. 10, May 11, 2000, pp. 876-878.

Eisele, H. et al., "Recent Advances in the Performance of InP Gunn Devices and GaAs TUNNETT Diodes for the 100-300-GHz Frequency Range and Above," IEEE Transactions on Microwave Theory and Techniques, vol. 48, No. 4, Apr. 2000, pp. 626-631.

Sollner, T.C.L.G. et al., "Observation of millimeter-wave oscillations from resonant tunneling diodes and some theoretical considerations of ultimate frequency limits," Appl. Phys. Lett., vol. 50, No. 6, Feb. 9, 1987, pp. 332-334.

Lheurette, E. et al., "In0.1Ga0.9As/GaAs/AlAs Pseudomorphic Resonant Tunnelling Diodes Integrated With Airbridge," Electronics Letters, vol. 28, No. 10, May 7, 1992, pp. 937-938.

(Continued)

*Primary Examiner*—T. N. Quach
(74) *Attorney, Agent, or Firm*—Edward L. Stolarun

(57) ABSTRACT

Disclosed is a method of determining causes of intrinsic oscillations in a double-barrier quantum-well intrinsic oscillator comprising developing an emitter quantum-well (EQW) from a double-barrier quantum-well system (DBQWS); coupling the EQW to a main quantum-well (MQW), wherein the MQW is defined by double-barrier heterostructures of a resonant tunneling diode; using energy subband coupling to induce quantum-based fluctuations in the EQW; creating intrinsic oscillations in electron density and electron current in the DBQWS; forming a distinct subband structure based on the intrinsic oscillations; and identifying a THz-frequency signal source based on the quantum-based fluctuations, wherein the intrinsic oscillations comprise maximum subband coherence, partial subband coherence, and minimum subband coherence, wherein the energy subband is a quantum mechanical energy subband, wherein the intrinsic oscillations occur proximate to a bias voltage point in the range of 0.224 V and 0.280 V, and wherein current oscillations are stable proximate to the bias voltage point.

20 Claims, 21 Drawing Sheets

OTHER PUBLICATIONS

Woolard, D.L. et al., "Intrinsic Oscillations in Resonant Tunneling Structures," 53rd Annual Device Research Conference Digest 1995, pp. 54-55.

Woolard, D.L. et al., "An Assessment of Potential Nonlinear Circuit Models for the Characterization of Resonant Tunneling Diodes," IEEE Transactions on Electron Devices, vol. 43, No. 2, Feb. 1996, pp. 332-341.

Boric-Lubecke, O. et al., "Fundamental and Subharmonic Excitation for an Oscillator with Several Tunneling Diodes in Series," IEEE Transactions on Microwave Theory and Techniques, vol. 43, No. 4, Apr. 1995, pp. 969-976.

Kidner, C. et al., "Power and Stability Limitations of Resonant Tunneling Diodes," IEEE Transactions on Microwave Theory and Techniques, vol. 38 No. 7, Jul. 1990, pp. 864-872.

Zhao, P. et al., "Operation Principle of Resonant Tunneling THz Oscillator at Fixed Bias Voltages," VLSI Design, vol. 00, No. 00, 2001, pp. 1-5.

Ricco, B. et al., "Physics of resonant tunneling. The one-dimensional double-barrier case," Physcial Review B, vol. 29, No. 4, Feb. 15, 1984, pp. 1970-1981.

Buot, F.A. et al., "Lattice Weyl-Wigner formulation of exact many-body quantum-transport theory and applications to novel solid-state quantum-based devices," Physical Review B, vol. 42, No. 15, Nov. 15, 1990, pp. 9429-9438.

Zhao, P. et al., "Quantum transport equations for single-band and multi-band semicoductors. I. Formaulation," Philosophical Magazine B, vol. 80, No. 7, 2000, pp. 1359-1392.

Bordone, P. et al., "Quantum transport of electrons in open nanostructures with the Wigner-function formalism," Physical Review B, vol. 59, No. 4, Jan. 15, 1999, pp. 3060-3069.

Jensen, K.L. et al., "Numerical Simulation of Intrinsic Bistability and High-Frequency Current Oscillations in Resonant Tunneling Structures," Physical Review Letters, vol. 66, No. 8, Feb. 25, 1991, pp. 1078-1081.

Schomburg, E. et al., "InGaAs/InAlAs superlattice oscillator at 147 GHz," Electronics Letters, vol. 35, No. 17, Aug. 19, 1999, pp. 1491-1492.

Zhao, P. et al., "Simulation of resonant tunneling structures: Origin of the I-V hysteresis and plateau-like structure," Journal of Applied Physics, vol. 87, No. 3, Feb. 1, 2000, pp. 1337-1349.

Biegel, B.A. et al., "Comparison of self-consistency iteration options for the Wigner function method of quantum device simulation," Physical Review B, vol. 54, No. 11, Sep. 15, 1996, pp. 8070-8082.

Presilla, C. et al., "Nonlinear feedback oscillations in resonant tunneling through double barriers," Physical Review B, vol. 43, No. 6, Feb. 15, 1991, pp. 5200-5203.

Woolard, D.L. et al., "On the different physical roles of hysteresis and intrinsic oscillations in resonant tunneling structures," J. Appl. Phys., vol. 79, No. 3, Feb. 1, 1996, pp. 1515-1525.

Kluksdahl, N.C. et al., "Self-consistent study of the resonant-tunneling diode," Physical Review B, vol. 39, No. 11, Apr. 15, 1989, pp. 7720-7735.

Frensley, W., "Boundary conditions for open quantum systems driven far from equilibrium," Reviews of modern Physics, vol. 62, No. 3, Jul. 1990, pp. 745-791.

Goldman, V.J. et al., "Observation of Intrinsic Bistability in Resonant-Tunneling Structures," Physical Review Letters, vol. 58, No. 12, Mar. 23, 1987, pp. 1256-1259.

Wigner, E., "On the Quantum Correction For Thermodynamic Equilibrium," Physical Review, vol. 40, Jun. 1, 1932, pp. 749-759.

Zhao, P. et al., "Dynamical instabilities and I-V characteristics in resonant tunneling through double-barrier quantum well systems," Physical Review B, vol. 63, No. 7, Jan. 18, 2001, pp. 1-14.

Woolard, D.L. et al., "THz-frequency intrinsic oscillations in double-barrier quantum well systems," Physica B, 314, 2002, pp. 108-112.

Lent, C.S. et al., "The quantum transmitting boundary method," J. Appl. Phys., vol. 67, No. 10, May 15, 1990, pp. 6353-6359.

Frensley, W., "Numerical Evaluation of Resonant States," Superlattices and Microstructures, vol. 11, No. 3, 1992, pp. 347-350.

Liu, Y.X. et al., "Efficient, numerically stable multiband k•p treatment of quantum transport in semiconductor heterostructures," Physical Review B, vol. 54, No. 8, Aug. 15, 1996, pp. 5675-5683.

* cited by examiner

MULTI-SUBBAND CRITERION FOR THE DESIGN OF A DOUBLE-BARRIER QUANTUM-WELL INTRINSIC OSCILLATOR

GOVERNMENT INTEREST

The invention described herein may be manufactured, used, and/or licensed by or for the United States Government.

BACKGROUND OF THE INVENTION

1. Field of the Invention

The invention generally relates to high-frequency power sources, and more particularly to a multi-subband design technique for a double-barrier quantum-well intrinsic oscillator defined by the double-barrier heterostructures of a resonant tunneling diode.

2. Description of the Related Art

Within this application several publications are referenced by Arabic numerals within brackets. Full citations for these and other publications may be found at the end of the specification immediately preceding the claims. The disclosures of all these publications as well as the heretofore referenced patents in their entireties are hereby expressly incorporated by reference into the present application for the purposes of indicating the background of the invention and illustrating the general state of the art.

Double-barrier quantum-well structures, such as those described in U.S. Pat. No. 5,844,253 issued to Kim et al. on Dec. 1, 1998, are well known in the semiconductor industry. The search for compact solid-state based, high-frequency power sources has been an important research subject for many years[1]. For many years, resonant tunneling diodes (RTD) have been treated as possible high frequency power sources[2]. However, as it is well known, the traditional implementation of a RTD has not been successful as a power source at terahertz (THz) frequencies[3, 5, 6]. Indeed, the output power of a RTD is on the order of $\mu$ watts at operation frequencies near 1 THz[5]. This failing is contributed by the extrinsic design manner of the oscillator that utilizes external circuit elements to induce the oscillation. This failing of the "traditional" RTD-based oscillator is tied directly to the physical principles associated with its implementations. In fact, the $f^{-2}$ law indicates that it is impossible to get higher output power at terahertz frequencies for a single device utilized in an extrinsic design manner[2].

In contrast to the extrinsic design of RTD oscillators, the intrinsic design of RTD oscillators makes use of the microscopic instability of RTDs directly[3, 7]. This type of an approach avoids the drawbacks associated with the extrinsic implementation of RTDs. It is believed that if the dynamics surrounding the intrinsic oscillation can be understood and controlled, RTD sources based on the self-oscillation process should yield milliwatt levels of power in the THz regime[3]. However, the exact origin of the intrinsic high-frequency current oscillation has not yet been fully established. The transport dynamics in RTDs is governed by the quantum mechanical tunneling process that occurs through a quantum-well that is formed by a double-barrier heterostructure. However, the lack of knowledge related to the origin of the intrinsic instabilities in double-barrier quantum-well structures (DBQWSs) directly hampers realizing an optimal design (device and circuit) of a RTD-based oscillator[4]. Thus, it is extremely important to understand the creation mechanism of the intrinsic instability in DBQWSs.

Historically, Ricco and Azbel suggested in their qualitative arguments, that intrinsic oscillation exists in a double barrier structure fur the case of one-dimensional transport[8]. Their theory attributed the instability to a process that cycled in and out of resonance. Specifically, when the energy of the incoming electrons matched the resonance energy, the tunneling current then charged the potential well and lifted its bottom, thus driving the system away from resonance. The ensuing current decrease (i.e., associated with the off-resonance) then reduced the charge in the well, bringing the system back to resonance, and a new cycle of oscillation commences. According to such a theory, there should be current oscillation at the resonance bias. However, numerical simulation results contradict this simple theory[9, 12, 15].

In another theory, it was suggested that the nonlinear feedback caused by stored charges in the quantum well was responsible for the creation of the current oscillation[16]. However, this phenomenological theory does not explain why the nonlinear feedback caused by stored charge in the quantum-well at bias voltages lower than those associated with resonance does not lead to current oscillation[23]. In subsequent studies of RTDs, Jensen and Buot observed intrinsic oscillations in their numerical simulations of DBQWSs[12]. However, this initial work fails to provide underlying explanations of the oscillation mechanism. Recently, Woolard et al. suggested that the current oscillation might be caused by the charge fluctuation near the emitter barrier of the RTD[17]. However, the cause of the charge oscillation and how the charge oscillation affects the electronic resonant tunneling were not clearly indicated. Hence, the origin of intrinsic oscillation has eluded revelation for many years.

Furthermore, very high frequency electron dynamics in tunneling structures is of fundamental importance to nano-electronics. Experimental investigations of similar time-dependent processes are also receiving more attention[13]. However, to date, there has not been a completely conclusive demonstration of intrinsic oscillations in RTDs. Hence, the development of an accurate fundamental technique that provides insight into the catalyst of the intrinsic oscillation is a key first step for the successful design of an RTD-based oscillator.

In earlier works, a new theory was presented that provided a basic idea for the origin of the intrinsic oscillation in DBQWSs[23] (hereinafter referred to as Paper I). This theory reveals that the current oscillation, hysteresis, and plateau-like structure in a I-V curve are closely related to the quantum mechanical wave/particle duality nature of the electrons. In addition, these effects were shown to be a direct consequence of the development and evolution of a dynamic emitter quantum well (EQW), and the ensuing coupling of the quasi-discrete energy levels that are shared between the EQW and the main quantum-well (MQW) formed by the DBQWS. Through this new understanding of the dynamic behavior of the RTD, it was possible to qualitatively predict the existence of an oscillation. However, while this initial description was able to self-consistently explain all the physical phenomena related to the intrinsic oscillation, it could not provide quantitative design rules.

Therefore, due to the limitations of the conventional techniques, processes, and theories, there remains a need for a multi-subband model for describing the electron dynamics in DBQWSs and an approach for the design and development of a semiconductor-based signal source at very high frequencies.

SUMMARY OF INVENTION

In view of the foregoing, an embodiment of the invention provides a method of determining causes of intrinsic oscillations in a double-barrier quantum-well intrinsic oscillator, wherein the method comprises developing an emitter quantum-well (EQW) from a double-barrier quantum-well system (DBQWS); coupling the EQW to a main quantum-well (MQW), wherein the MQW is defined by double-barrier heterostructures of a resonant tunneling diode; using energy subband coupling to induce quantum-based fluctuations in the EQW; creating intrinsic oscillations in electron density and electron current in the DBQWS; forming a distinct subband structure based on the intrinsic oscillations; and identifying a THz-frequency signal source based on the quantum-based fluctuations, wherein the intrinsic oscillations comprise maximum subband coherence, partial subband coherence, and minimum subband coherence, wherein the energy subband is a quantum mechanical energy subband, wherein the intrinsic oscillations occur proximate to a bias voltage point in the range of 0.224V and 0.280V, and wherein current oscillations are stable proximate to the bias voltage point.

In another embodiment, the invention provides a method of enhancing a semiconductor-based signal source, wherein the method comprises forming a double barrier quantum well structure (DBQWS) comprising an emitter region, a collector region, and a first and second barrier region disposed between the emitter and collector region; creating an artificial barrier region adjacent the first barrier region; transforming the artificial barrier region into a shallow emitter quantum well (EQW) region; coupling the EQW to a main quantum-well (MQW) region; using energy subband coupling to induce quantum-based fluctuations in the EQW; creating intrinsic oscillations in electron density and electron current in the DBQWS; forming a distinct subband structure based on the intrinsic oscillations; and identifying a THz-frequency signal source based on the quantum-based fluctuations.

In yet another embodiment, the invention provides a method of designing a double-barrier quantum-well intrinsic oscillator, wherein the method comprises developing an emitter quantum-well (EQW) from a double-barrier quantum-well system (DBQWS); coupling the EQW to a main quantum-well (MQW), wherein the MQW is defined by double-barrier heterostructures of a resonant tunneling diode in the DBQWS; using energy subband coupling to induce quantum-based fluctuations in the EQW; inducing intrinsic oscillations in electron density and electron current, wherein the intrinsic oscillations comprise maximum subband coherence, partial subband coherence, and minimum subband coherence; forming a distinct subband structure based on the intrinsic oscillations; and identifying a THz-frequency signal source based on the quantum-based fluctuations.

The invention prescribes an approach for the design and development of a semiconductor-based signal source at very high frequencies (i.e., approximately 300 GHz to 5 THz). The invention provides a design criterion, which provides for the following advantages. A key advantage of the technique provided by the invention is that one can induce intrinsic oscillations through the clever design of double-barrier quantum-well structures. An oscillator source that utilizes intrinsic oscillations has the potential for reaching very high operation frequencies in the range above 300 GHz to about 5 THz. Here, the intrinsic oscillation phenomenon is facilitated through quantum fluctuations induced by quantum mechanical subband coupling mechanisms. The invention also provides guidance for utilizing alternative nanoscale structures and band-structure engineering for realizing enhanced oscillation amplitudes. This translates directly into high levels of output power.

The invention also discloses fundamental physical concepts related to the quantum mechanical principles of instability. Here, the invention provides a solution of how to engineer the quantum mechanical energy levels and envelope functions such that one can achieve enhancement to the oscillation amplitudes. This also translates directly into high levels of output power.

These, and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

The invention will be better understood from the following detailed description of the preferred embodiments of the invention with reference to the drawings, in which.

DETAILED DESCRIPTION OF PREFERRED EMBODIMENTS OF THE INVENTION

Figure 1:
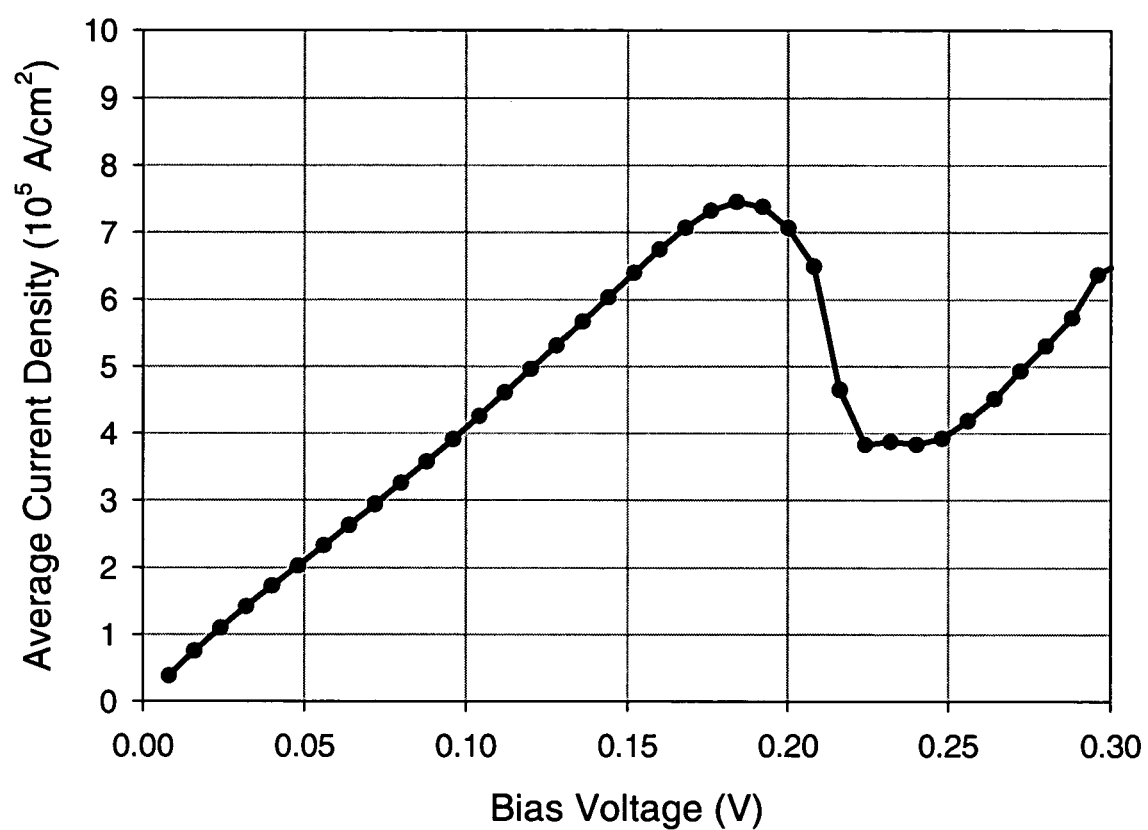
FIG. 1 is a graphical representation illustrating the current-voltage (I-V) characteristics of a double barrier quantum well structure (DBQWS) according to the simulation studies of the invention.

The invention and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the invention in detail.

As previously mentioned, there is a need for a multi-subband model for describing the electron dynamics in DBQWSs and an approach for the design and development of a semiconductor-based signal source at very high frequencies. Referring now to the drawings, and more particularly to FIGS. 1 through 11(c), there are shown preferred embodiments of the invention.

The invention provides device embodiments and design criterion for realizing a THz-frequency signal source that can reach significant levels of output power (e.g., milliwatt levels). The signal source concept provided by the invention can be utilized in advanced sensors and short-range communication applications, as well as for a signal source for THz-frequency transmission spectroscopy of chemical and biological agents, and a signal source for short-range THz-frequency communications.

Essentially, the invention identifies a THz-frequency signal source based upon quantum mechanical fluctuation mechanisms. Moreover, the invention defines the underlying physical mechanisms that control the frequency of the oscillation. Additionally, the invention identifies a class of structures that can be used to invoke the oscillator process. Furthermore, the invention prescribes basic techniques for the enhancement of the oscillation amplitudes. The embodiments presented by the invention indicate that it is possible to implement a very high frequency signal source through the engineering of double-barrier quantum well structures.

A design criterion for the origin of high frequency current oscillations in double-barrier quantum-well structures (DBQWSs) is presented herein. The origin of the current oscillations is traced to the development of a dynamic emitter quantum well (EQW) and the coupling of that EQW to the main quantum well (MQW), which is defined by the double-barrier quantum-well system. The relationship between the oscillation frequency and the energy level structure of the system is demonstrated to be $v=\Delta E_0/h$. Insight into DBQWSs as potential devices for very high frequency oscillators is facilitated through two simulation studies. First, a self-consistent, time-dependent Wigner-Poisson numerical investigation is used to reveal sustained current oscillations in an isolated DBQWS-based device. Furthermore, these terahertz-frequency oscillations are shown to be intrinsic and capable of being enhanced using emitter engineering procedures.

Second, a multi-subband based procedure for calculating $\Delta E$, which is the energy separation of the quantum states in the system that are responsible for the instability mechanism, is also presented. Together, these experimental studies establish the fundamental principals and basic design criterion for the development and implementation of DBQWS-based oscillators. Furthermore, the invention provides physical interpretations of the instability mechanisms and explicit guidance for defining new structures that will admit enhanced oscillation characteristics.

The invention extends the earlier theories through the application of basic quantum mechanical models. According to the fundamental theory of quantum mechanics, there are two equivalent methods for determining the energy levels of a coupled system if the system can be viewed as the combination of several subsystems. The first method treats the subsystems separately initially and then models the interaction between the subsystems to get the combined energy-level structure of the entire system. The second method deals with the system as a whole and obtains the energy-level structure by direct solution of Schrödinger's equation. The advantage of the latter is that it can give an exact description of the system's energy subbands without the development of models for the subsystems. The invention develops a multi-subband model for the description of the electron dynamics in DBQWSs. The multi-subband based model provided by the invention describes a relationship between the oscillation frequency and the energy-level structure of the system. A method for calculating the energy levels for an open quantum system is also provided. This subband model is combined with time-dependent Wigner-Poisson simulation results to provide: (1) a quantitative explanation for the origin of the intrinsic oscillations in RTDs; and (2) a detailed design methodology for a future implementation and optimization of DBQWS-based THz oscillators.

First, the fundamental theory for the origin of the intrinsic instability in DBQWSs is described. Later, numerical simulation techniques for generating the current oscillation behavior in RTDs (i.e., through the Wigner-Poisson Model) and a numerical methodology for generating the multi-subband structure in DBQWS (i.e., through Schrödinger's equation model) are described. Thereafter, the results from both numerical simulations are included in an analysis of the instability behavior to establish the underlying mechanisms influencing the intrinsic oscillations. Finally, general conclusions and design rules are described.

General Instability Theory

Previously, a qualitative explanation was given for the creation of intrinsic oscillations in a Double-Barrier Quantum-Well Structure[23]. In this prior work, the oscillations were recognized to arise primarily from two interrelated processes. The first step being the creation of an emitter quantum-well (EQW); i.e., in front of the first heterostructure barrier, which dynamically occurs just as the device is being biased into the negative differential resistance (NDR) regime. The intrinsic oscillations are then induced as a secondary result of the coupling between the EQW and the main quantum-well (MQW) that is defined by the DBQWS. Here, the creation, time-dependent fluctuation and subsequent disappearance of the EQW are key processes that determine the formation of the I-V characteristics and the intrinsic high frequency current oscillation. For example, FIGS. 3 through 5 show the results of a simulation study on an emitter-engineered DBQWS and illustrate the dynamic behavior of the potential and current density profiles. The intrinsic current-density oscillations result from very small quantum-based fluctuations in potential and are not driven by a charge exchange between EQW and MQW[24]. Here, the potential variations within the EQW and MQW are completely in phase and this indicates that the oscillation is purely of quantum mechanical origin. This is further discussed below.

This analysis and physical interpretation of the intrinsic oscillation phenomena is directly supported by detailed numerical simulation[23], however, it is important and insightful to offer a more fundamental and mathematically rigorous explanation for the physical argument. While it is clear that the defined energy coupling between EQW and MQW is crucial to the process, it is important to note that the previous statements are somewhat qualitative in nature. Specifically, while the EQW is the fundamental catalyst, there is a dynamic coupling between the spatially separated quantum wells that influences and ultimately determines the time-dependent energy levels of the entire system. Indeed, the time-dependent tunneling transport that occurs within the DBQWS is strictly a multi-subband physical process. The invention provides a simplified multi-subband analysis to be used to derive a quantitative description of the intrinsic current oscillation behavior.

The electron transport under study is occurring within a time-dependent quantum system with dissipation and this system is subject to open boundary conditions. In this type of situation, one must consider quasi-discrete electron transport where a density of available tunneling states exists across a continuous energy space. A rigorous analysis requires that a fully time-dependent quantum mechanical description be applied (e.g., Schrödinger's equation) to derive the peaks of the time-dependent tunneling probability, which could then be used to predict the most probable energy states of the electron dynamics. In other words, the energy levels that it sought to identify cannot be rigorously derived as energy eigenvalues, as this is not a proper eigenvalue problem; i.e., it is an open and dissipative system and one that is subject to instability. However, the quasi-discrete energy level structure can be estimated through an approximate analysis based upon the time-independent Schrödinger's equation.

The justification of this approach can be derived as follows. As previously stated, the transport problem under study will contain time-dependent potential energy profiles under some conditions (i.e., when intrinsic oscillations are present) and this profile may be written generally as $U(z, t) = U_0(z) + \Delta U(z, t)$, where the last term contains all the time dependency. As just noted, in this situation most of the electron transport will occur through a set of quasi-bound resonant energy levels; i.e., defined by the peaks in the transmission function. The wavefunction associated with each of these subbands may be modeled as:

$$\Psi_k(z, t) = e^{\frac{-i}{\hbar} F_k(t)} \psi_k(z, t), \quad (1)$$

where $$F_k(t) = \int_0^t dt' E_k(t')$$

and $E_k(t)$ have been defined as the real part of the time-dependent quasi-bound energy state and $\psi_k(z, t)$ is the wavefunction amplitude. The quasi-bound system is now described by:

$$\hat{H}(z, t)\Psi_k(z, t) = i\hbar \frac{\partial \Psi_k(z, t)}{\partial t} \quad (2)$$
$$= \frac{\partial F_k(t)}{\partial t}\Psi_k(z, t) + i\hbar \frac{\Psi_k(z, t)}{\psi_k(z, t)} \frac{\partial \psi_k(t)}{\partial t}$$

In the limit of very small time-dependent potential variations; i.e., $\Delta U(z, t) \rightarrow 0$, it follows that $\partial \psi_k(z, t) \rightarrow 0$, which leads immediately to:

$$\hat{H}(z, t)\Psi_k(z, t) = E_k(t)\Psi_k(z, t) \quad (3)$$

since $$\frac{\partial F_k(t)}{\partial t} = E_k(t).$$

Specifically, when the potential variations in time are sufficiently weak then the model coefficients (i.e., $\psi_k(z, t)$) are slowly varying. This allows one to approximate the quasi-bound energy levels using the time-independent Schrödinger's equation and to approximate the time-dependent wavefunction using Equation (1). According to the simulation studies performed in conjunction with the invention, electron transport through a single-band system (i.e., conduction band) is considered and an object is to derive expressions for electron current and density in terms of the subband structure for a DBQWS. In this multiple energy-state semiconductor system, the wavefunction for the electrons can be written generally as:

$$\psi(z, t) = \sum_{k=1}^{N} \Psi_k(z, t). \quad (4)$$

Here, the previously derived model equation, $$\Psi_k(z, t) = e^{\frac{-i}{\hbar} F_k(t)} \psi_k(z, t),$$

will be utilized where $$F_k(t) = \int_0^t dt' E_k(t')$$

and $E_k(t)$ is the real-component of the energy associated with the kth energy level. Here, the wavefunction $\psi_k(z, t)$ is assumed independent of the $E_k(t)$. In fact, $\psi_k(z, t)$ can be viewed as the kth subband energy-level coefficient for the total wavefunction that incorporates the effects of dissipative or energy gains induced either by scattering (e.g., electron-phonon) or the applied bias source, respectively. For the simulation studies provided, time variations in $\psi_k(z, t)$ due to either internal dissipation or external energy gains are not on the order of those under consideration (i.e., $10^{12}$ hertz). Specifically, dissipation effects will not lead to oscillatory behavior that persists and the externally applied biases are time-independent. The electron current and carrier densities can be easily derived from the subband wavefunctions as:

$$J = -\frac{i\hbar}{2m} \{\psi^*(x, t) \nabla \psi(x, t) - (\nabla \psi^*(x, t)) \psi(x, t)\} \equiv \langle \psi | \hat{j} | \psi \rangle \quad (5)$$

where $$\hat{j} = \frac{i\hbar}{m^*}(\nabla^+ - \nabla)$$

is the current density operator. Equations (5) and (6) explicitly demonstrate the importance of a device energy-level structure in determining the time-dependent, or oscillatory behavior of electron transport through the system. Substituting Equation (4) into Equations (5) and (6), yields:

$$J(t) = \langle \psi | \hat{j} | \psi \rangle \quad (7)$$

$$= \sum_k \langle \psi_k(t) | \hat{j} | \psi_k(t) \rangle +$$

$$2 \operatorname{Re} \sum_{k,l(l<k)} \langle \psi_k(t) | \hat{j} | \psi_l(t) \rangle \cdot e^{-i\frac{F_l(t) - F_k(t)}{\hbar}}$$

and $$\rho(t) = |\psi|^2 \quad (8)$$

$$= \sum_k |\psi_k(t)|^2 + 2 \operatorname{Re} \sum_{k,l(l<k)} \psi_k^*(t) \psi_l(t) e^{-i\frac{F_l(t) - F_k(t)}{\hbar}}$$

The oscillation terms in the above equation will usually be removed by the cancellation effect induced by variations in phase (e.g., unequal subband structures leading to conditions such that $E_{1_1} - E_{k_1} \neq E_{1_2} - E_{k_2}$. When these conditions apply, the transport can be described simply as an individual summation over single subbands. Hence, there is no coupling between the bands and no intrinsic oscillations. This is analogous to the more typical transport problems where interband coupling can be ignored and only the first terms in Equations (7) and (8) are necessary. In fact, it is in this type of situation where the concept of band transport is most often applied and most useful. However, an accurate and useful characterization of intrinsic oscillation behavior must include effects resulting from multi-subband coupling. The time-dependent nature of the electron transport that may arise due to interband coupling can be characterized for various levels of oscillation strength. The relative strengths of the interband oscillations may be conveniently classified into three categories: maximum subband coherence, partial subband coherence, and minimum subband coherence.

Case 1. Maximum Subband Coherence.

If it is assumed that conditions sufficient for intrinsic oscillations exist, the strongest oscillations (i.e., largest time-dependent variations in current density) will occur when all the energy-dependent phase factors in Equations (7) and (8) are equivalent and when all contribute to the instability. This condition of maximum coherence is directly defined by the resulting subband structure and is given by the relation:

$$\Delta E(t) = \Delta E_{lk}(t) = |E_l(t) - E_k(t)| = \text{const and } l \in \{l_i\}, k \in \{k_j\} \quad (9)$$

where the sets $\{l_i\}$ and $\{k_j\}$ are equal and assume all possible values from the number sequences 1, 2, . . . , n such with $(l_i < k_j)$. Additionally, the phase factor defined in Equation (9) must possess a natural time dependency. This is true because any condition of oscillation in current density will be accompanied by a corresponding oscillation in the band structure of the device. In turn, this will lead to time-dependent perturbations in the subband structure and the general expression for the phase factor in Equation (9). In this case, the current density and carrier density can be written as:

$$J(t) = \langle \psi | \hat{j} | \psi \rangle \quad (10)$$

$$= \sum_k \langle \psi_k(t) | \hat{j} | \psi_k(t) \rangle +$$

$$2 \operatorname{Re} \left\{ e^{-i\frac{\Delta F(t)}{\hbar}} \sum_{k,l(l<k)} \langle \psi_k(t) | \hat{j} | \psi_k(t) \rangle \right\}$$

and $$\rho(t) = |\psi|^2 \quad (11)$$

$$= \sum_k |\psi_k(t)|^2 + 2 \operatorname{Re} \left\{ e^{-i\frac{\Delta F(t)}{\hbar}} \sum_{k,l(l<k)} \psi_k^*(t) \psi_l(t) \right\}$$

where $$\Delta F(t) = \int_0^t dt' \Delta E(t')$$

and $E_k(t)$. The superposition of all the in-phase contributions (i.e., second terms on the right hand side of Equations (10) and (11)) defines the maximum amplitudes for oscillations in current density and electron density. Moreover, the inner product terms are not capable of directly contributing to the intrinsic oscillation phenomenon as previously discussed. While this condition of complete regularity in the subband structure leads to the strongest oscillations, it is also the most stringent and difficult to realize in practice.

Case 2. Partial Subband Coherence.

The next level of oscillation condition is characterized by the condition where a finite and countable number of energy-dependent phase factors in Equations (7) and (8) are equivalent and where each of these contribute to the instability. This condition of partial subband coherence is defined by:

$$\Delta E(t) = \Delta E_{lk}(t) = |E_l - E_k| = \text{const and } l \in \{l_i\}, k \in \{k_j\} \quad (12)$$

where the sets $\{l_i\}$ and $\{k_j\}$ are equal, with $(l_i < k_j)$, and assume some of the values from the number sequences 1, 2, ..., n. In this case, the current density and the carrier density can be expressed as:

$$J(t) = <\psi|\hat{j}|\psi> \quad (13)$$
$$= \sum_k <\psi_k(t)|\hat{j}|\psi_k(t)> +$$
$$2\,\text{Re}\left\{e^{-i\frac{\Delta F(t)}{\hbar}} \sum_{k,l(l<k),l=l_i,k=k_j} <\psi_k(t)|\hat{j}|\psi_k(t)>\right\} +$$
$$\sum_{k,l(l<k),l=l_i,k=k_j} <\psi_k(t)|\hat{j}|\psi_k(t)> e^{-i\frac{F_l - F_k}{\hbar}}$$

and $$\rho(t) = |\psi|^2 = \sum_k |\psi_k(t)|^2 + 2\,\text{Re}\left\{e^{-i\frac{\Delta F(t)}{\hbar}t} \sum_{k,l(l<k),l=l_i,k=k_j} \psi_k^*(t)\psi_l(t)\right\} + \sum \psi_k^*(t)\psi_1(t)e^{-i\frac{F_l - F_k}{\hbar}} \quad (14)$$

Under these conditions, the in-phase contributions from only the second terms on the right hand side of Equations (13) and (14) will contribute to the intrinsic oscillations as the last terms lack sufficient coherence.

Case. 3 Minimum Subband Coherence.

The last and weakest form of intrinsic oscillations is characterized by the condition where only a single set of subbands contributes to the instability. The energy difference of the subbands is $$\Delta E(t) = |E_l - E_k| \quad (15)$$

where 1 and k can assume only one set of values from the energy level index 1, 2, ..., n and 1<k. In this case, the current density and carrier density can be written as:

$$J(t) \le \psi|\hat{j}|\psi \ge \quad (16)$$
$$\sum_k <\psi_k(t)|\hat{j}|\psi_k(t)> +2\,\text{Re}\left\{e^{-i\frac{\Delta F(t)}{\hbar}} <\psi_{kj}(t)|\hat{j}|\psi_{l_i}(t)>\right\} +$$
$$\sum_{k,l(l<k,l\ne l_i,k\ne k_j)} <\psi_k(t)|\hat{j}|\psi_l(t)> e^{-i\frac{F_l - F_k}{\hbar}}$$

and $$\rho(t) = |\psi|^2 = \sum_k |\psi_k(t)|^2 + \quad (17)$$
$$2\,\text{Re}\left\{e^{-i\frac{\Delta F(t)}{\hbar}t}\psi_{k_j}^*(t)\psi_l(t)\right\} + \sum_{k,l(l<k,l\ne l_i,k\ne k_j)} \psi_k^*(t)\psi_1(t)e^{-i\frac{F_l - F_k}{\hbar}t}$$

As in the prior case, the in-phase contributions from only the second terms on the right hand side of Equations (16) and (17) will contribute to the intrinsic oscillations. For each of the three previous subband coherence cases, the current density and the carrier density can be expressed most generally as:

$$J(t) = <\psi|\hat{j}|\psi> = \sum_k <\psi_k(t)|\hat{j}|\psi_k(t)> +2\,\text{Re}\left\{e^{-i\frac{\Delta F(t)}{\hbar}}P(t)\right\} \quad (18)$$

and $$\rho(t) = |\psi|^2 = \sum_k <\psi_k(t)|\psi_k(t)> +2\,\text{Re}\left\{e^{-i\frac{\Delta F(t)}{\hbar}}G(t)\right\} \quad (19)$$

where the functions P and G are slowly-varying functions of time. Here, the incoherent subband terms in Equations (18) and (19 have been excluded. Also while the first terms have been retained, they only contribute to short term transients and to the final static components of current density and electron density[7]. P incorporates the effects from the subband coupling and actually represents the inter-subband current. Similarly, function G accounts for the contribution to the charge density from the coupling between the subbands. The expressions defined in Equations (18) and (19) reveal that intrinsic high frequency oscillations can arise in any quantum system from the wavefunction coupling between multi-subbands. The relative strength of that instability being specifically achieved once the subbands structure satisfies one of the criterion given in Equations (9), (12), or (15). Further analysis of the equations can provide a clear physical picture regarding the creation of the oscillation. The key being the energy-dependent phase factors. The conventional simulations have shown that the self-consistent potential varies in a periodical form[7]. Thus, it is reasonable to express the energy difference as:

$$\Delta E(t) = \Delta E_0 + f(\omega, t) \quad (20)$$

where $f(\omega, t)$ is a periodical function and $\omega$ is the oscillation frequency. Analysis of the phase variations in P and G are discussed below. $\Delta E_0$ is defined as the average difference between two energy levels for a system subject to intrinsic oscillations, or the energy difference at the balance point. The phase differences in Equations (18) and (19) between time $t_1$ and $t_2$ can be written as:

$$\Delta\phi(t_1, t_2) = \frac{1}{\hbar}(\Delta F(t_2) - \Delta F(t_1)) = \frac{\Delta E_0}{\hbar}(t_2 - t_1) + \frac{1}{\hbar}\int_{t_1}^{t_2} dt' f(\omega, t') \quad (21)$$

Recognizing that the phase variation in one period is $2\pi$, the oscillation frequency of electron current due to the subband structure is given by:

$$\frac{1}{T} = \frac{\Delta E_0}{\hbar} \quad (22)$$

where T is the period of the intrinsic oscillation. The previous derivation allows a physics-based description for the creation of the intrinsic oscillation. An accurate physical model for this instability process will be able to describe the time-dependent variations in electron density and potential energy. For example, consider an arbitrary oscillation process and assume that the density of electrons at a particular real-space point reaches its maximum value at $t_0$. The corresponding potential energy at this same space point will also assume its maximum value at time $t_0$ since the Poisson-based interaction potential is being considered. Assuming an oscillation condition exists, this variation in both electron density and electron potential energy will cycle periodically as the phase varies over $2\pi$. The model equations in (15) and (16) for electron current-density and electron density directly exhibit this type of behavior through the energy-dependent phase factors. In turn, this model imposes variations in the potential energy through the application of Poisson's equation. Most importantly, the feedback influence of potential energy variations on the energy-dependent phase-factor (i.e., defined in Equations (20), (21), and (22)) is incorporated into the analysis.

This quantum-based model allows one to interrogate the intrinsic oscillation process to determine the underlying physical mechanisms responsible for the instability. Specifically, if detailed simulations are utilized to derive values for the subband structure and the appropriate $\Delta E_0$ under the condition of intrinsic oscillation, then insight into the fundamental catalysts can be obtained. Furthermore, as described below, this information can be used to predict methods for enhancing the oscillation strength in quantum-well systems.

Next, simulation tools and studies are provided that allow for a complete analysis of the intrinsic oscillations in DBQWSs. In particular, Wigner-Possion Equation simulations and Schrödinger-based simulations are used together to derive current density oscillations, the subband phase factor, and the subband wavefunction amplitudes. This information is combined with the previous model to reveal the fundamental origins of intrinsic oscillations and is used to predict structural modifications that lead to enhanced instabilities in arbitrary quantum-well systems.

Numerical Techniques

1. Wigner-Poisson Model:

The Wigner function formulation of quantum mechanics is selected for the simulation studies because of its many useful characteristics for the simulation of quantum-effect electronic devices, including the natural ability to handle dissipate and open-boundary systems. The Wigner function equation was first employed in quantum device simulation by Frensley[26]. Later, Kluksdahl et al. incorporated Poisson's equation (PE) and applied the model to the study of RTD with self-consistent potentials[81]. The Wigner function equation (WFE) can be derived in several ways[22]. Since the Wigner function may be defined by non-equilibrium Green's functions, the WFE may be derived from the equation of motion of the non-equilibrium Green's function[9, 10]. The lowest order approximation to scattering is considered only:

$$\frac{\partial f}{\partial t} = -\frac{\hbar k}{2\pi m^*}\frac{\partial f}{\partial x} - \quad (23)$$
$$\frac{1}{\hbar}\int dk' f(x, k') \int dy[U(x+y) - U(x-y)]\sin[2y(k-k')] + \frac{\partial f}{\partial t}\bigg|_{coll}$$

where h is the Planck's constant, m* is the electron effective mass and U is the conduction-band-edge. The appropriate treatment of scattering in semiconductors is very important for getting accurate transport results. Recent research has shown that the computation burden associated with a detailed consideration of electron-phonon scattering is very formidable. Typical computer CPU times required for the calculation of one point in the I-V curve are in the order of 30 hours on a 100 CPU-Cray T3E machine[11]. This significant amount of computation time severely impedes a study if the electron scattering was modeled from first principles. Thus, the relaxation time approximation to scattering has been employed in the simulation studies presented herein. In terms of the relaxation time approximation to scattering, the collision terms in the above equation may be written as[9].

$$\frac{\partial f}{\partial t}\bigg|_{coll} = \frac{1}{\tau}\left[\frac{f_0(x, k)}{\int dk f_0(x, k)}\int dk f(x, k) - f(x, k)\right] \quad (24)$$

where $\tau$ is the relaxation time and $f_0$ is the equilibrium Wigner function. Further details regarding the physical model used for deriving $\tau$ are given in the Appendix immediately preceding the References section, which immediately precede the claims. The device under study is subject to open boundaries at the emitter and collector, hence, the boundary conditions in the Wigner function are:

$$f_{x=0,k>0} = \frac{4\pi m^* k_b T}{\hbar^2}\ln\left\{1 + \exp\left[-\frac{1}{k_B T}\left(\frac{\hbar^2 k^2}{8\pi^2 m^*} - \mu_0\right)\right]\right\} \quad (25)$$

$$f_{x=L,k<0} = \frac{4\pi m^* k_b T}{\hbar^2}\ln\left\{1 + \exp\left[-\frac{1}{k_B T}\left(\frac{\hbar^2 k^2}{8\pi^2 m^*} - \mu_L\right)\right]\right\} \quad (26)$$

The second equation used in the RTD model is the Poisson equation (PE):

$$\frac{d^2}{dx^2}u(x) = \frac{q^2}{\varepsilon}[N_d(x) - n(x)] \quad (27)$$

where $\epsilon$ is the dielectric permittivity, u(x) is the electrostatic potential, q is the electronic charge, $N_d(x)$ is the concentration of ionized dopants, and n(x) is the density of electrons, given by:

$$n(x) = \int_{-\infty}^{\infty} \frac{dk}{2\pi} f(x, k) \tag{28}$$

The current density may be written as:

$$j(x) = \int_{-\infty}^{\infty} \frac{dk}{2\pi} \frac{\hbar k}{m^*} f(x, k) \tag{29}$$

To solve the WFE-PE equations, equations (28) and (29) must be discretized over the simulation domain. For the one-dimensional transport case considered here, the discretization of the PE is trivial, and is easily understood by those skilled in the art. Therefore, only the discretization of the WFE is discussed. Details of this procedure are well described by Jensen and Buot[12]. Hence, only a summary of the method is provided herein. Assuming the simulation box is between x=0 and x=L, the domain may be discretized as follows:

$$f(x, k) = f(x_i, k_j) = f_{ij}, \tag{30}$$

$$x_i = \frac{(i-1)L}{(N_x - 1)} = (i-1)\delta x, \quad \delta x = \frac{L}{(N_x - 1)}, \tag{31}$$

$$k_j = \frac{(2j - N - 1)\delta k}{2}, \quad \delta k = \frac{\pi}{N\delta x}. \tag{32}$$

where $N_x$ and N are the number of x and k points on a grid in phase space. The time-dependent Wigner function equation can be written as:

$$\frac{\partial f}{\partial t} = \frac{\mathcal{L}}{i\hbar} f$$

where $$\mathcal{L} = i(T+V+S) \tag{34}$$

In the above equation, T, V, and S are the drift, potential, and scattering terms, respectively. Using a second-order upwind difference scheme to discrete the position derivative, they can be expressed as:

$$T \cdot f(x, K) = -\left[\frac{\hbar^2 \delta k}{2m^* \delta x}\right](2j - N - 1)\Delta^{\pm} f(i, j), \tag{35}$$

$$\Delta^{\pm} f(i, j) = \pm \frac{1}{2}[-3f(i) + 4f(i \pm 1) - f(i \pm 2)], \tag{36}$$

$$V \cdot f = \sum_{j'=1}^{N} V(i, j - j') f(i, j), \tag{37}$$

$$V(i, j) = \frac{2}{N} \sum_{i'=1}^{N/2} \sin\left[\frac{2\pi}{N} i' j\right][U(i+i') - U(i-i')], \tag{38}$$

-continued $$S \cdot f = \frac{\hbar}{\tau}\left\{f(i, j) - \frac{\delta k f_0(i, j)}{2\pi\rho(i)} \sum_{j'=1}^{N} f(i, j')\right\}. \tag{39}$$

The discretized density of electrons and current density may be written, respectively, as:

$$n(i) = \frac{\delta k}{2\pi} \sum_{j=1}^{N} f(i, j) \tag{40}$$

and $$J\left(i + \frac{1}{2}\right) = \frac{\hbar \delta k}{8\pi^2 m^*} \sum_{j=1}^{N} k_j \begin{cases} 3f(i+1, j) - f(i+2, j), & j \leq \frac{1}{2}N \\ 3f(i, j) - f(i-1, j), & j > \frac{1}{2}N \end{cases} \tag{41}$$

The formal solution of Equation (30) is:

$$f(t + \Delta t) = e^{\frac{iL}{\hbar}t} f(t) = \frac{1 - \frac{iL}{2\hbar}t}{1 + \frac{iL}{2\hbar}t} \tag{42}$$

Equation (42) may be written as:

$$[-r+\zeta][f(t+\Delta t)+f(t)]-2rf(t) \tag{43}$$

where $$r = \frac{2\hbar}{\Delta t}.$$

In descreting Equation (43), the boundary condition information has been incorporated into the drift term. The boundary condition does not change with time. Thus, Equation (43) becomes:

$$[-r + \tilde{\mathcal{L}}][f(t + \Delta t) + f(t)] = -2rf(t) + 2BC \tag{44}$$

where $\tilde{\mathcal{L}}$ is the same operator as defined by Equation (31) except that the boundary conditions on Wigner function; i.e., now denoted as BC, have been factored out.

In the discretization of Equations (23) and (27), the dielectric function of the material and the effective mass of electrons is taken to be constant throughout the structure. In these studies, the conduction band profile is first approximated by a square well potential and n(x) is derived through the use of Equations (23) and (28). Subsequently, this value of electron density is substituted into the Poisson equation and then the new conduction band profile $U(z)=u(z)+\Delta_c(z)$ is calculated, where $\Delta_c(z)$ is the offset of the band-edge. Using this new conduction band profile at next time step, the Wigner function equation is solved again. This iteration continues until steady-state or a per-assigned time value is achieved.

In order to ensure the convergence of the numerical simulation results, a very small time step is used in the simulation. The time step is 1 fs. Furthermore, several structures are tested with different momentum and position-space discretizations and different simulation boxes to ensure that accurate simulation results are obtained. Details on the types of simulations to be used have been previously presented[23]. Moreover, the numerical technique adapted according to the invention is a well-established approach and has been used widely. The accuracy of this approach has also been verified before within similar simulations[9, 12, 18, 23].

2. Multi-Subband Model:

As will be shown, the results obtained from the Wigner-Poisson transport simulations yield intrinsic current-density oscillations and a time-dependent potential energy profile. This implies that the energy level structure must change with the time variation of the double-barrier tunneling structure. Furthermore, if one energy subband exists to conduct the current before the creation of the emitter quantum well (EQW), there will be at least two energy levels available for passing the current after the creation of the EQW. According to the invention, a key to understanding the intrinsic oscillation process is contained within the dynamics of the subband structure after the EQW is created. Hence, direct information regarding the energy structure must be generated to reveal the underlying mechanisms.

As previously discussed, it is appropriate to use a quasi-bound subband description of the electron transport for cases of time-dependent potentials with small variations in amplitude. This allows one to approximate the position of the quasi-bound energy levels using the time-independent Schrödinger's equation even if the potential energy profile of the DBQWS is time-dependent. This approach is applied to determine the energy subband structure for an open transport system. These non-resonant scattering states are determined using a numerical approach similar to that used by Frensley and Liu[26, 27] However, the specific approach utilized according to the invention introduces strictly open boundary conditions to the problem. In discrete form, the Schrödinger's equation can be written as:

$$-\frac{\hbar^2}{2m^*\Delta^2}\psi_{i-1} + \left(\frac{\hbar^2}{m^*\Delta^2} + V(x_i) - E\right)\psi_i - \frac{\hbar^2}{2m^*\Delta^2}\psi_{i+1} = 0 \quad (45)$$

where $\Delta$ is the spatial mesh spacing which is assumed constant everywhere. Equation (45) ignores changes in effective mass across hetero-interfaces. Outside of the device boundaries, the incident, reflected, and transmitted wavefunctions can be modeled as:

$$\psi_{in} = e^{-ik_0 x} + re^{ik_0 x} \text{ for } x \leq 0 \quad (46)$$

$$\psi_{out} = te^{ik_n x} \text{ for } x \geq 1 \quad (47)$$

At the boundaries, one may enforce the conditions:

$$\frac{1}{m^*}\frac{\partial \psi}{\partial x} = \frac{1}{m^*}\frac{\partial \psi_{in}}{\partial x} \text{ for } x \leq 0 \quad (48)$$

$$\frac{1}{m^*}\frac{\partial \psi}{\partial x} = \frac{1}{m^*}\frac{\partial \psi_{out}}{\partial x} \text{ for } x > 1 \quad (49)$$

The discrete equations at the boundaries may be defined using Equations (46)–(49) as:

$$(ik_0\Delta - 1)\psi_1 + \psi_2 = 2ik_0\Delta r; \quad (50)$$

$$-\psi_{n-1} + (1 - ik_n\Delta)\psi_n = 0. \quad (51)$$

Defining that $$s_j = \frac{\hbar^2}{2m^*\Delta^2} \quad (52)$$

and $$d_j = -\frac{\hbar^2}{m^*\Delta^2} + V(x_j) \quad (53)$$

and leads to the discrete equations on the interior points of:

$$s_j\psi_{j-1} + (d_j - E)\psi_j - s_{j+1}\psi_{j+1} = 0 \quad (54)$$

The previous discrete system of equations may be used to determine the subbands upon application of the appropriate boundary conditions. The equations that were previously defined for transport outside the boundaries and that were applied to derive the discrete boundary relations have implicitly defined an open system; i.e., as there is an incident flux. Also, the system is derived for arbitrary levels of reflection at the input boundary (i.e., x=0 point). Under these general conditions it is not directly possible to define the allowable energy levels for unknown values of reflection. Fortunately, as discussed below, the subbands of interest according to the invention admit either very small or zero levels of reflection. Specifically, the invention considers the DBQWS under conditions of large DC biases. Hence, the highest energy levels are approximately resonant and suffer very little reflection. Furthermore, the lower energy states are bound from the left by the emitter barrier and must have r=0 to admit physically plausible solutions (i.e., decaying to the left). Hence, for the simulation studies provided by the invention, the reflection coefficient, r, is approximated to be zero. This allows the discrete system to be written in the matrix form $G\psi=0$ as follows:

$$(ik_0\Delta - 1)\psi_1 + \psi_2 = 0 \quad (55)$$

$$-s_j\psi_{j-1} + (d_j - E)\psi_j - s_{j+1}\psi_{j+1} = 0 \text{ for } j \geq 2, j \leq n-1 \quad (56)$$

$$-\psi_{n-1} + (1 - ik_n\Delta)\psi_n = 0 \quad (57)$$

The previous E-dependent system can now be used to determine the allowable energy states of the system. The sufficient and necessary condition that the above equations have solutions is that the coefficient determinant of the equations is equal to zero. The coefficient determinant can be recursively expanded as:

$$f_1 = ik_0\Delta - 1 \quad (58)$$

$$f_2 = (d_2 - E) + s_2 \quad (59)$$

$$f_j = (d_j - E)f_{j-1} - s_j^2 f_{j-2} \text{ for } 3 \leq j \leq n-1 \quad (60)$$

$$f_n = (1 - ik_n\Delta)f_{n-1} - s_n f_{n-2} \quad (61)$$

By setting the recursive determinant to zero, $f_n=0$, the equation for determining the energy levels of the open system is obtained. Substituting the calculated energy levels into Equations (55) to (57) allows for the calculation of the non-normalized wavefunctions. The introduction of the zero-reflection condition on the input boundary introduces at least a small error into the subband estimation. However, the zero-reflection condition does not directly affect the accuracy of the lower energy-states (i.e., those with energy less than the conduction band energy at x=0) calculation. Indeed they are only perturbed through the estimates on the total charge in the emitter region, which in turn affects the depth of the EQW. Also, the zero-reflection condition should be much more accurate than invoking a closed system condition (i.e., incident wave equal to zero) that should significantly shift the energy levels upward.

Simulation Results and Instability Analysis

Jensen and Buot first numerically observed the intrinsic oscillations. Thereafter, Biegel and Plummer obtained very similar results upon analysis of the same double-barrier structure[12, 15]. This identical double-barrier RTD was also previously investigated within the simulation study herein and high-frequency intrinsic oscillations were also observed. The conventional approaches utilize uniform doping within the emitter region. Because, as will be illustrated below, the emitter plays a crucial role in the origin of the intrinsic oscillations, these conventional approaches did not adequately probe the underlying physical mechanisms. In fact, very recent studies have shown that emitter-engineered structures can be used to enhance the amplitude of the intrinsic oscillation in resonant tunneling diodes (RTDs)[24].

In the device structure of the previous study[24], an alternating doping profile is utilized to modify the conduction band at the electron injection point and to create a transport conditions more conducive to intrinsic oscillations. The simulation results show that the emitter-engineered region favors the creation of the oscillations in the following aspects. First, the modified emitter induces an artificial barrier in front of the GaAs/AlGaAs heterojunction barrier thereby directly facilitating the formation of a shallow emitter quantum well (EQW) in front of the first barrier. The creation of an EQW is the necessary condition for the creation of the intrinsic current oscillation. Hence, a shallow EQW exists in advance and contributes to the quantum-well inducing interference-depletion mechanism, which is a significant advantage. Second, the duel-barrier structure (i.e., now formed from the built-in barrier at the emitter contact and the first RTD barrier) within the emitter region prohibits the propagation of reflected waves back into the open-boundary reservoir. This influence tends to increase the amplitude of the electron wave in the emitter region and favors the further enhancement of the interference of the electron waves in the emitter thereby leading to a deeper EQW.

The analysis of the intrinsic instability phenomenon provided by the invention utilizes known emitter-engineered structures[24]. The modified GaAs/AlGaAs double-barrier quantum-well system (DBQWS) of the invention preferably has the following symmetric structure: total emitter length of 270 Å with a 30 Å spacer, 30 Å barriers, 50 Å quantum well, and total collector length of 270 Å with a 30 Å spacer. The emitter-engineered system preferably has a 270 Å long emitter region of the form (from left to right): 30 Å doped $10^{18}$ cm$^{-3}$, 50 Å doped $10^{18}$ cm$^{-3}$, 160 Å doped $10^{18}$ cm$^{-3}$. The quantum well region is undoped and the collector is symmetrically doped with the emitter. The heterostructure barrier heights are 0.3 eV —corresponding to the GaAs/Al$_{0.3}$Ga$_{0.7}$As interfaces. The effective mass of electron is assumed to be a constant and equals 0.0667m$_0$; and the device temperature is 77 K. A relatively low temperature must be employed to allow for electron interference within the emitter and the subsequent formation of the EQW. Bulk GaAs parameters are used to calculate the relaxation time and the chemical potential, wherein the compensation ratio for scattering calculations is 0.3. The chemical potential is determined by $$\int_0^\infty \sqrt{\varepsilon}\, f(\varepsilon)\, d\varepsilon = \frac{2}{3}\mu(T=)^{3/2},$$

where $f(\epsilon)$ is the Fermi distribution function. The numerical simulator utilizes discretizations for momentum and position space of 98 and 82 points, respectively.

Figure 2:
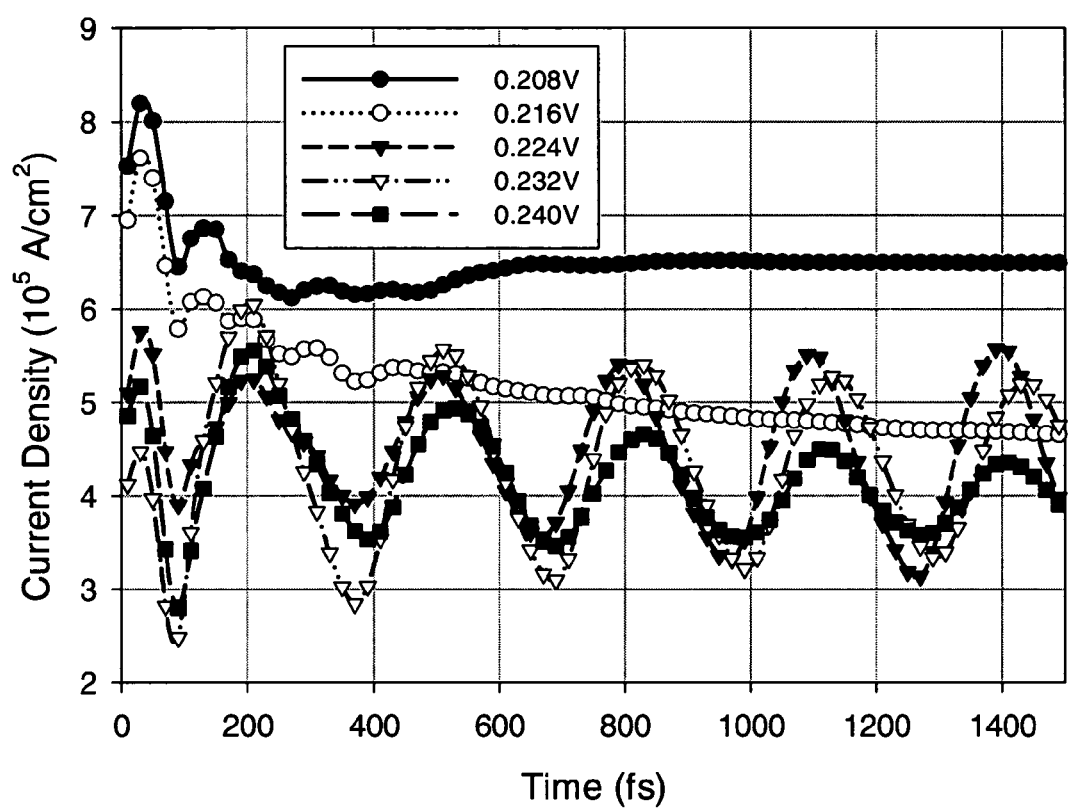
FIG. 2 is a graphical representation illustrating the current density as a function of time for a DBQWS over a bias voltage window of 0.208V to 0.240V with a current oscillation period of 300 fs at 0.224V according to the simulation studies of the invention.
Figure 3A:
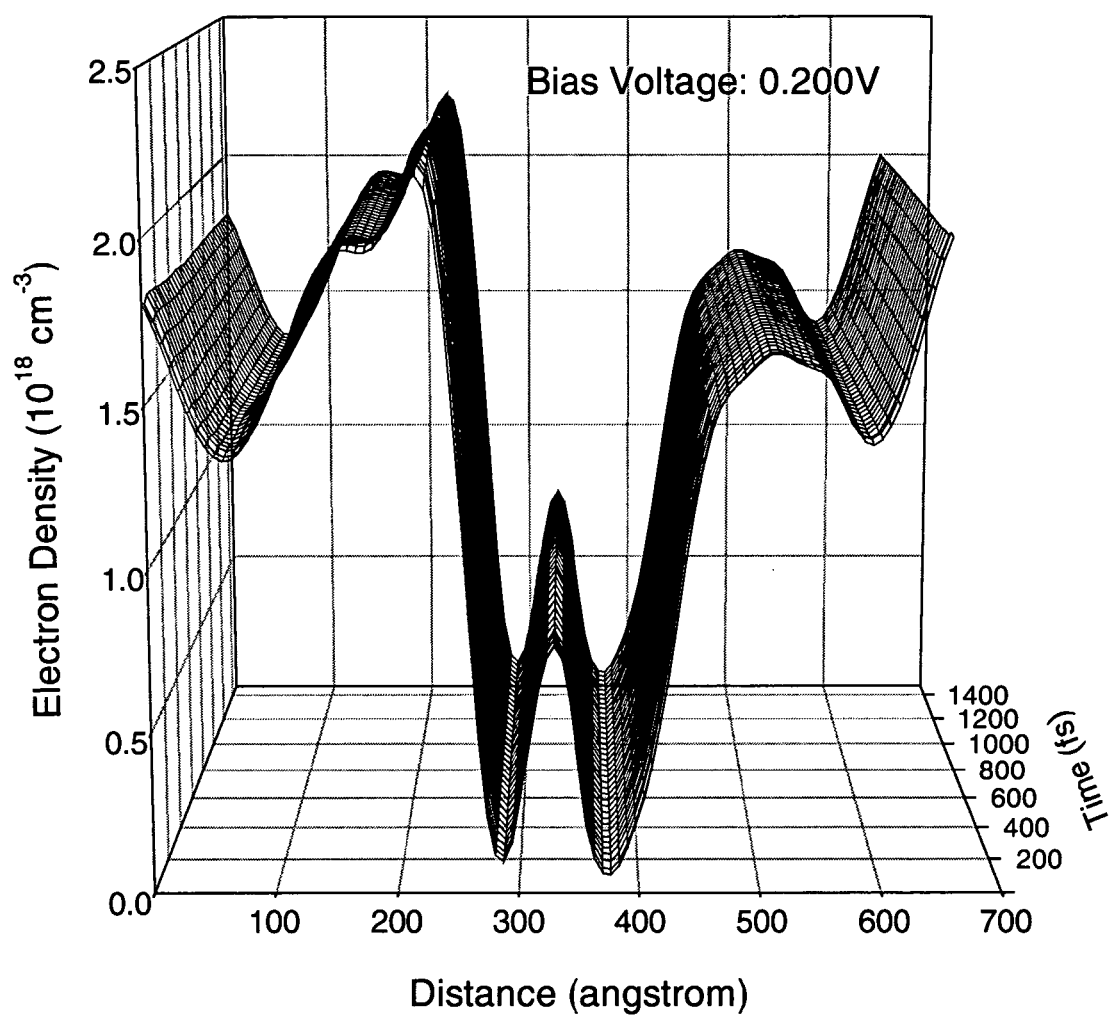
FIG. 3(a) is a graphical representation illustrating the time evolution of the electron density distribution at a bias voltage of 0.200V according to the simulation studies of the invention.
Figure 3B:
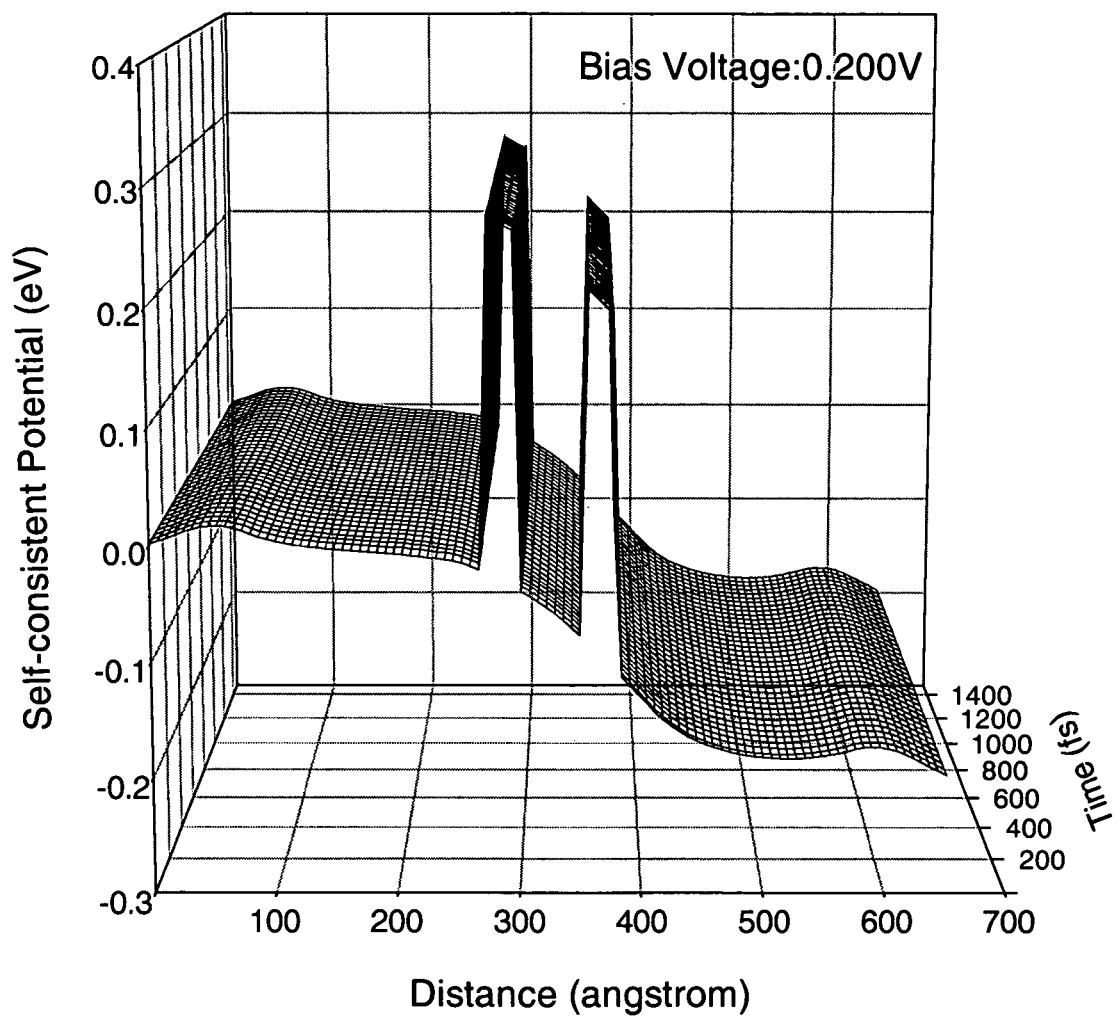
FIG. 3(b) is a graphical representation illustrating the time evolution of the self-consistent potential energy at a bias voltage of 0.200V according to the simulation studies of the invention.
Figure 4A:
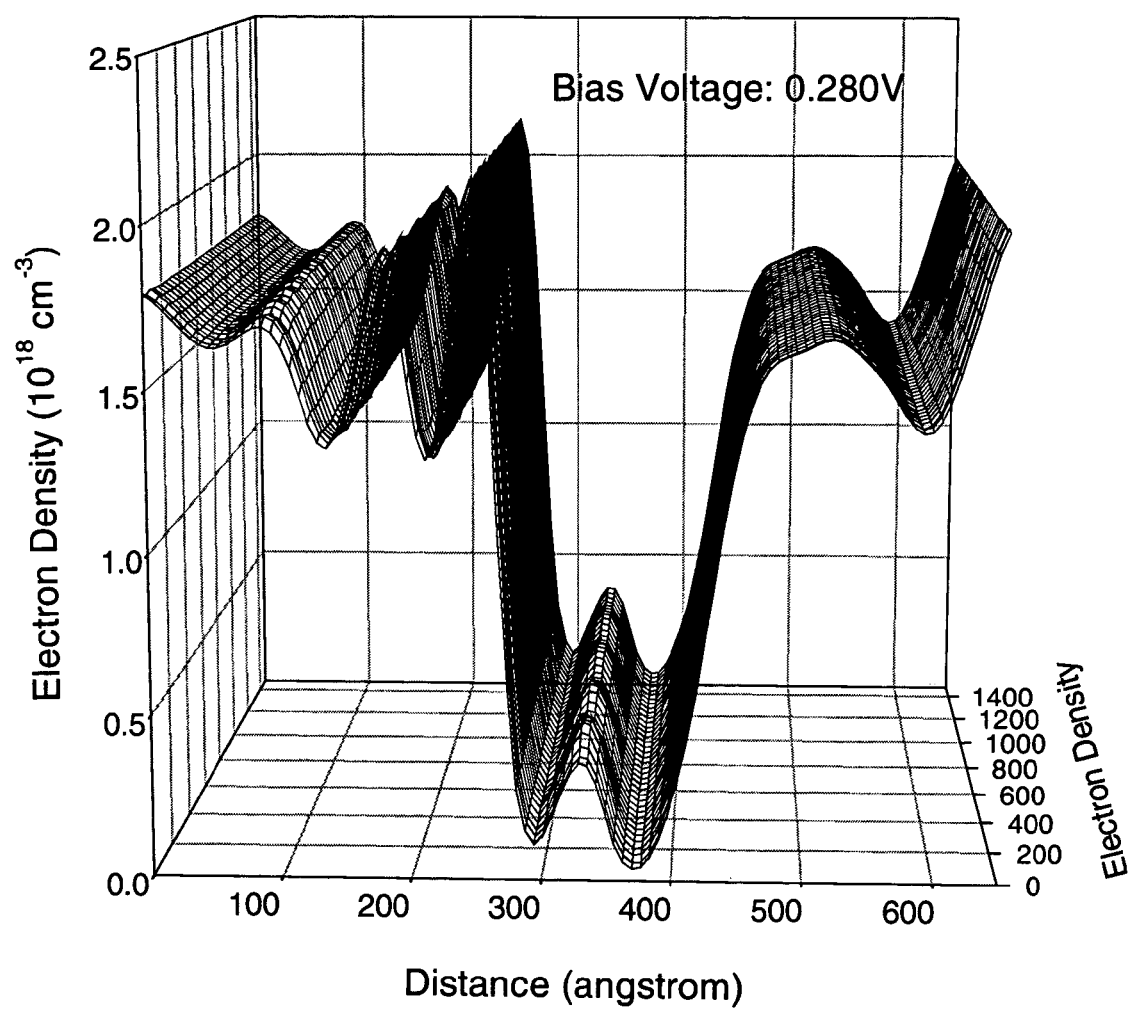
FIG. 4(a) is a graphical representation illustrating the time evolution of the electron density distribution at a bias voltage of 0.280V according to the simulation studies of the invention.
Figure 4B:
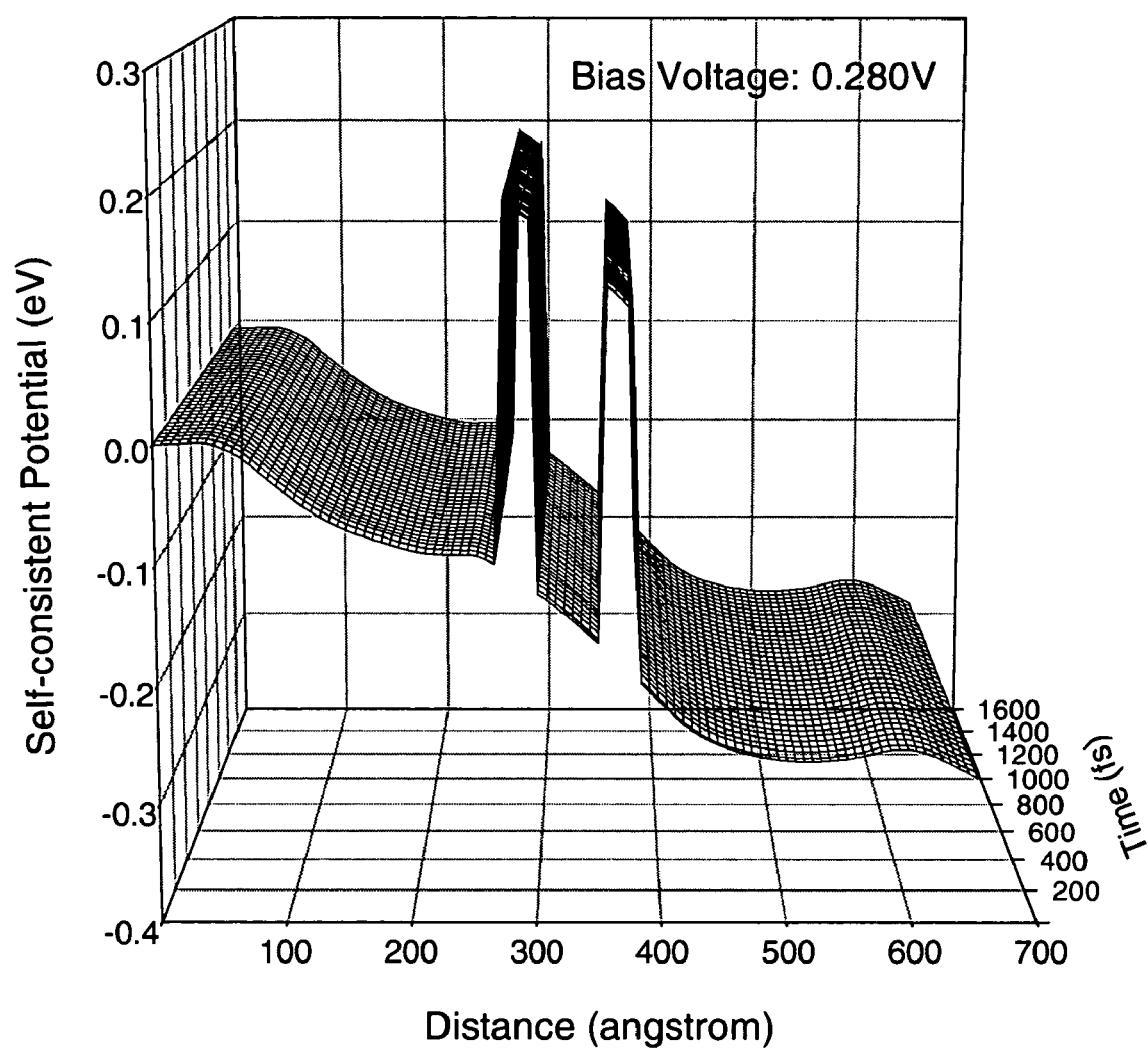
FIG. 4(b) is a graphical representation illustrating the time evolution of the self-consistent potential energy at a bias voltage of 0.280V according to the simulation studies of the invention.
Figure 5A:
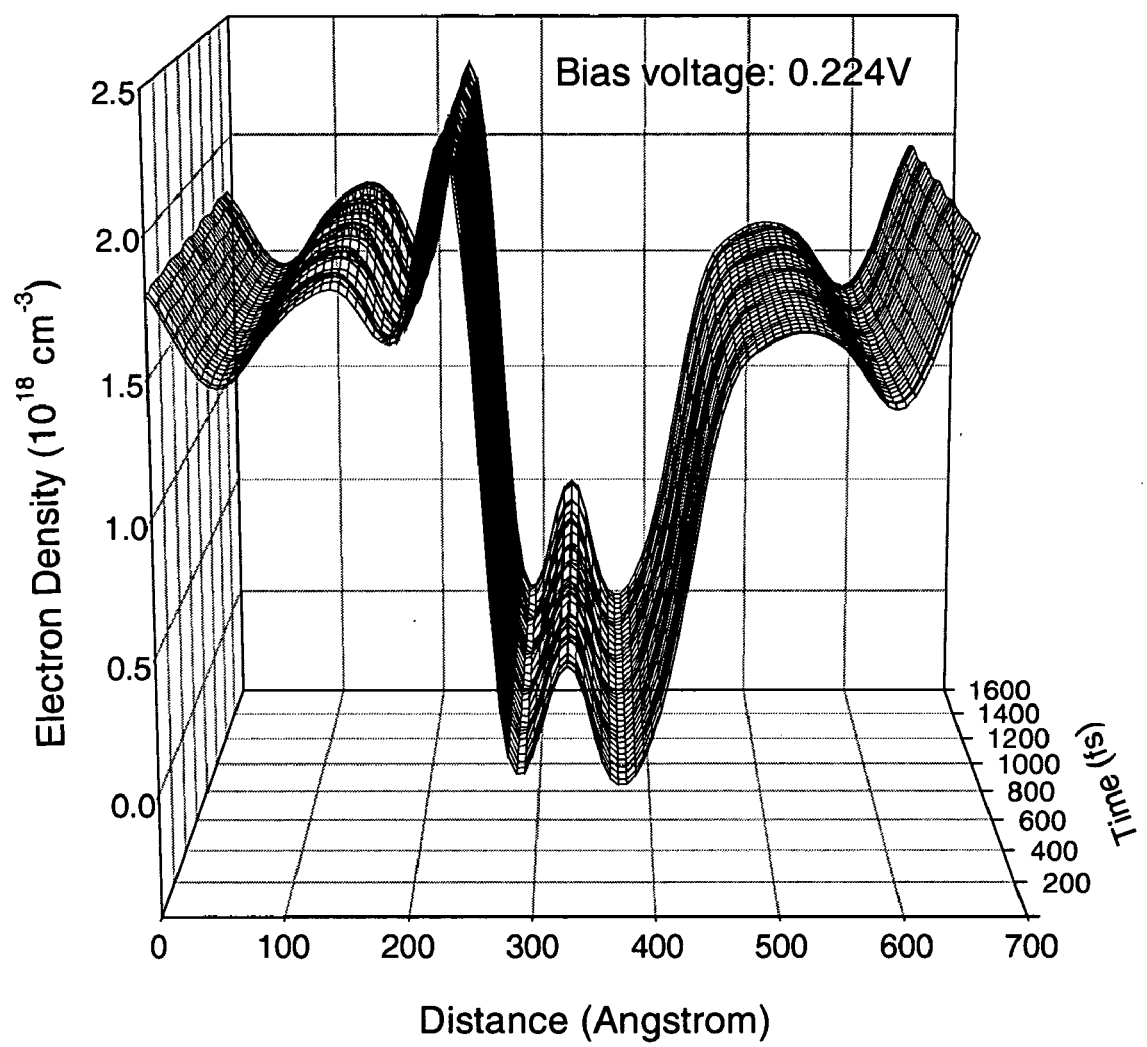
FIG. 5(a) is a graphical representation illustrating the time evolution of the electron density distribution at a bias voltage of 0.224V according to the simulation studies of the invention.
Figure 5B:
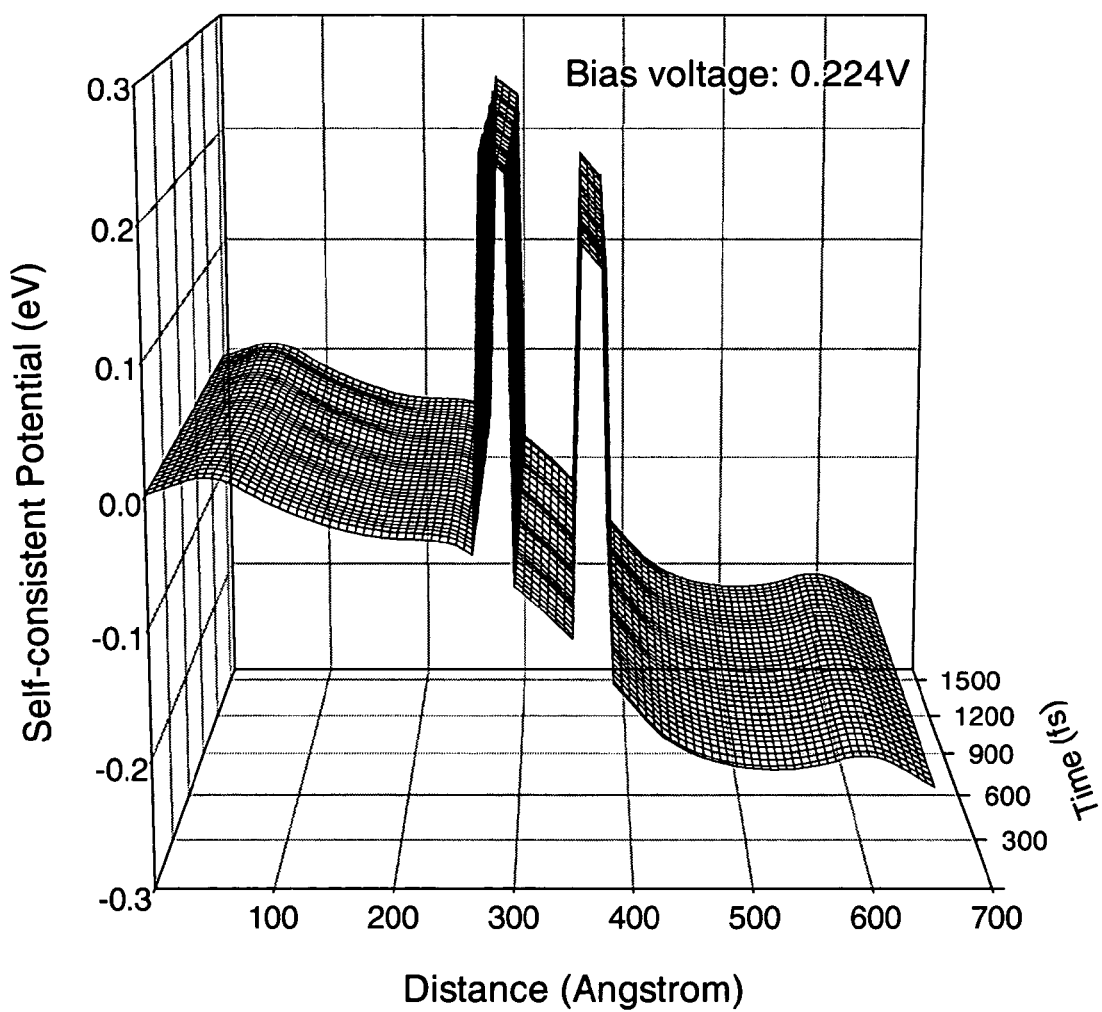
FIG. 5(b) is a graphical representation illustrating the time evolution of the self-consistent potential energy, at a bias voltage of 0.224V according to the simulation studies of the invention.

1. Simulations Results:

First, the simulation results generated from the Wigner-Poisson model, which was previously presented, is considered. FIG. 1 shows the average I-V characteristics for the emitter-engineered DBQWS. The I-V characteristic exhibits the well-known Z-like feature, which have been observed often in experimental measurements. Instability in the current densities is present within the bias region 0.224V to 0.240V. FIG. 2 plots the current density as a function of time for several values of the applied bias. These simulation results exhibit the following important features. First, there is a bias voltage window (BVW), defined from 0.224V to 0.240V, in which the current demonstrates intrinsic oscillations. Second, in the vicinity of the bias voltage point 0.224V, the current oscillations are stable (i.e., oscillatory and non-decaying). In the invention's simulation, the total simulation time is taken to be 1500 ps. Completely stable oscillations were only observed within a small range around the bias point 0.224V. FIGS. 3–5 show time-dependent self-consistent potential and electron density at the bias voltages 0.260V, 0.224V, and 0.280V, respectively. Collectively, FIGS. 3(a), 3(b), 4(a), 4(b), 5(a), and 5(b) give the potential profiles and electron density distributions in the BVW and outside the BVW.

From these figures (FIGS. 3(a),(b)–5(a),(b)) it is apparent that the current oscillation is concurrent with oscillations of potential and electron densities in the whole region of the device. The oscillations have the following noteworthy features. Before the bias reaches the BVW region, the potential and electron density oscillate irregularly for a short time before settling into a stable state. This oscillatory feature, which spans across a significant region of bias, offers strong evidence against Ricco and Azbel's theory on the origin of the current oscillation in double barrier systems. As these oscillations do not correspond to a bias point just before the onset of negative differential resistance. In the BVW, all of the non-periodic transients of the potential and the electron density cease after a hundred femtoseconds. Furthermore, all oscillations are significantly damped outside the BVW. The time dependent results for a potential profile and electron density can be used to reveal some of the underlying causes for the intrinsic oscillations in DBQWSs.

The simulation results show that upon entering the BVW an EQW is observed to form in front of the first barrier structure. According to conventional qualitative and time-dependent quantum-energy-level-coupling models, the fundamental origin of the intrinsic oscillation can be understood on the following basis. After the bias voltage passes the resonant point, the sudden increase in the electron reflection coefficient associated with the DBQWS leads to a dramatic increase in the amplitude of the reflected electron wave. The interference between the injected and the reflected electron waves causes a large spatial depletion of electron density in the emitter region[14]. The depletion of electrons induces a drop in the potential and forms an EQW. Also, the depth of the EQW increases with the increase of the bias voltage and the energy level of the EQW separates from the three-dimensional states in the emitter region. Furthermore, the interaction between the energy levels (including the conduction-band-edge in the emitter) in the EQW and that in the main quantum well (MQW) greatly influences the transport of electrons through the DBQWS.

Several factors jointly influence the tunneling process. The coupling between the conduction band edge in the EQW and the lowest energy level in the MQW plays a key role and tends to lift the energy level in the MQW, while at the same time depressing the conduction band edge in the EQW. On the other hand, the applied bias has exactly the opposite effect on energy level in the MQW. The interplay of these two opposite forces determines the existence of the EQW and thereby the major features of the current-time and current-voltage characteristics. Unfortunately, these conventional techniques, based upon coupling mechanisms between EQW and MQW, do provide a qualitative explanation for the origin of the instability. Thus, a more detailed and in-depth investigation is required to establish a robust and quantitative description of the oscillation physics, which the invention provides.

Figure 6:
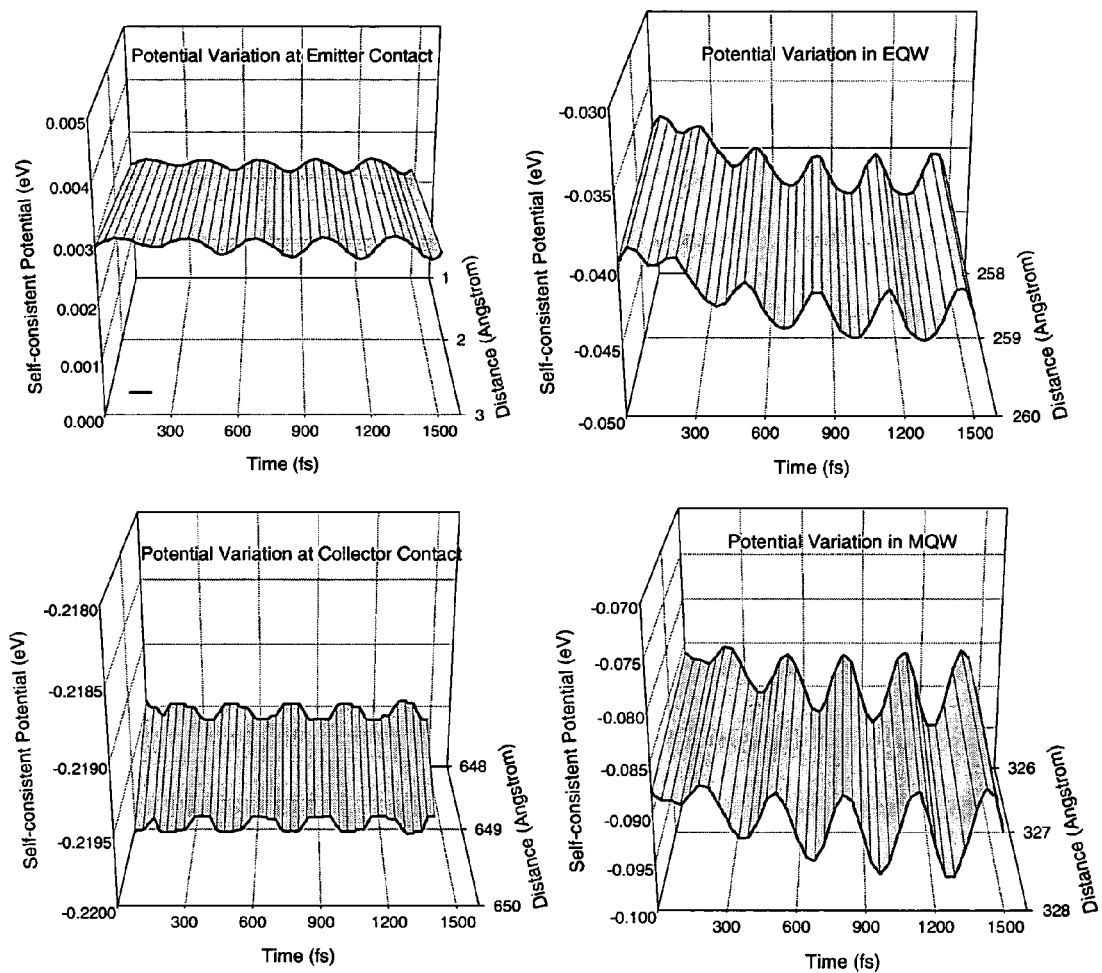
FIG. 6 is a graphical representation illustrating the time evolution of the potential energy profile at various locations within the DBQWS according to the simulation studies of the invention.
Figure 7:
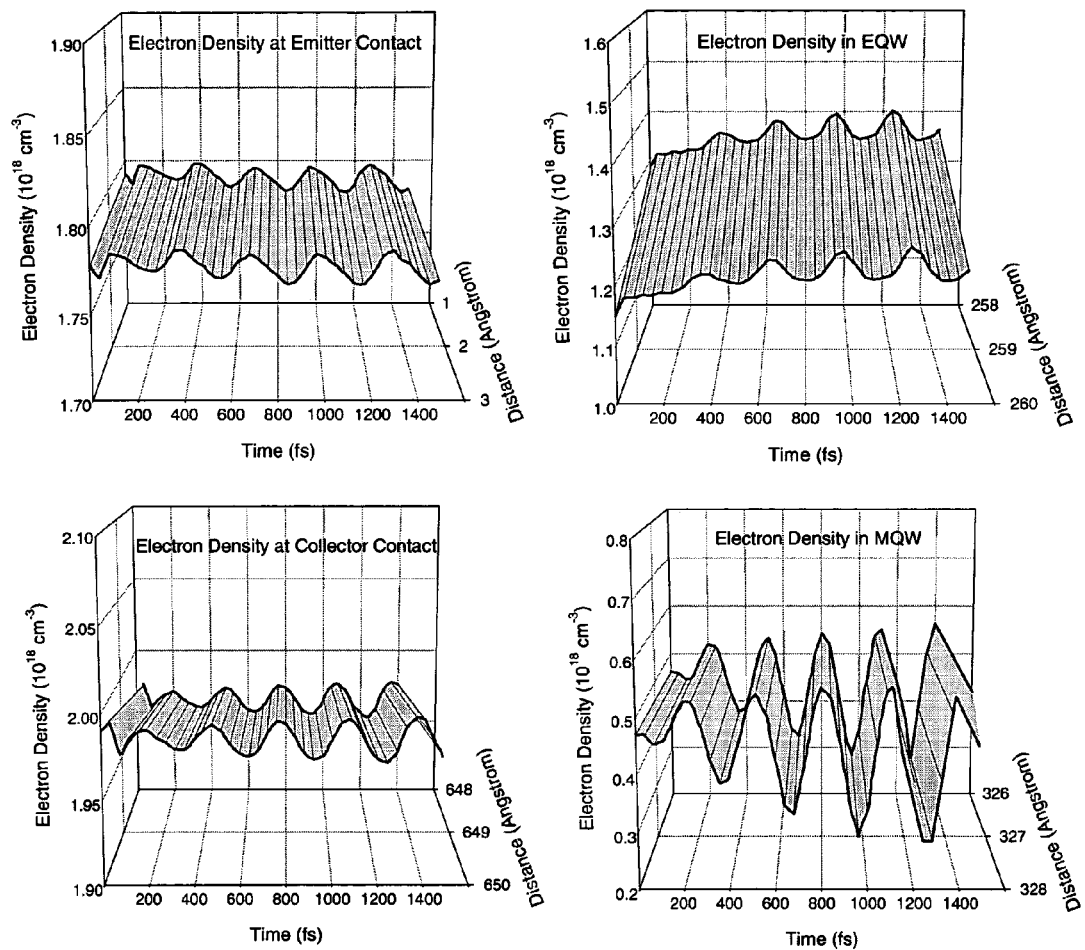
FIG. 7 is a graphical representation illustrating the time evolution of the electron density profile at various locations within the DBQWS according to the simulation studies of the invention.

The electron potential oscillations are completely in phase within the coupled well system. For example, FIGS. 6 and 7 show simulation results for several regions of the device and illustrate the instability dynamics. As shown in FIG. 6, the potential energy variations within the EQW and MQW have nearly identical phase. On the other hand, FIG. 7 shows that the electron density within the EQW and the MQW are almost completely out of phase. Hence, the small fluctuations in potential energy are not induced as a direct result of cyclic charging and discharging of the coupled well system. Hence, the instability in the DBQW tunneling structure is arising directly out of quantum-coupling between EQW and MQW. Of course, the in-phase fluctuations in the potential barrier structure lead to changes in the tunneling characteristics, which induces charging (or discharging) of the MQW at the expense (or benefit) of the EQW. This process also leads to a time-dependent current density. Therefore, this is a purely quantum mechanical oscillation process and a complete description of the dynamics will require an investigation into the energy subband structure as derived above. Furthermore, the use of the general equations developed above requires that the time-dependent subband structure be generated from numerical calculations. A numerical method for calculating the energy level structure of an open system has been described above for this exact purpose.

The Schrödinger equation based model described above is applied to derive the quasi-bound subband structure of the DBQWS. Here, the time-dependent potential-energy profiles that were generated by the Wigner-Poisson model are utilized. These time-dependent tunneling structure profiles can be used to generate time-dependent subband behavior that is approximately consistent (i.e., except for energy-state broadening) with the observed current density oscillations. As previously mentioned, the open system conditions were approximated by assuming that the reflection from the source boundary was small (i.e., r=0). As described below, this is an acceptable approximation because the most important subbands to the oscillation process are bound from the source-side when biases corresponding to the BVW are applied. Hence, the reflected-component of the emitter wavefunction must be zero for these subbands at the source boundary otherwise the solution would be nonphysical.

Figure 8A:
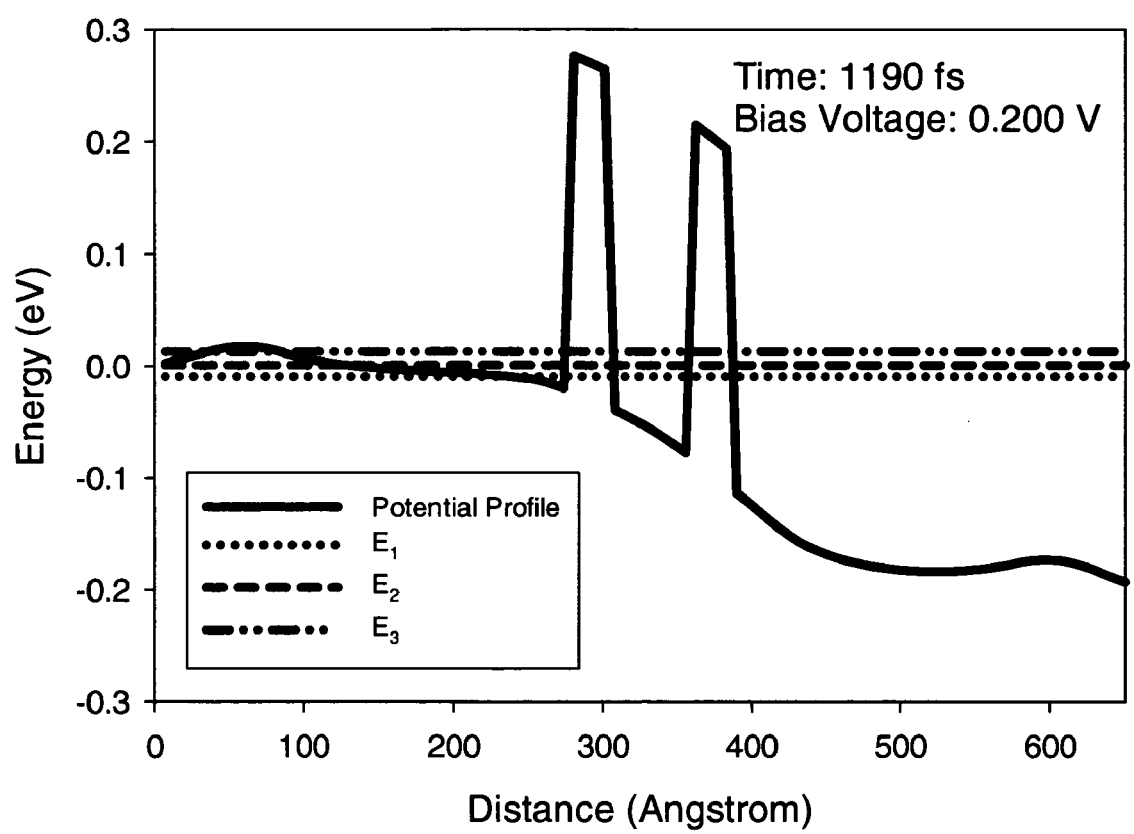
FIG. 8(a) is a graphical representation illustrating the energy subband structure referenced to the potential energy profile at a bias voltage of 0.200V and at time 1190 fs according to the simulation studies of the invention.
Figure 8B:
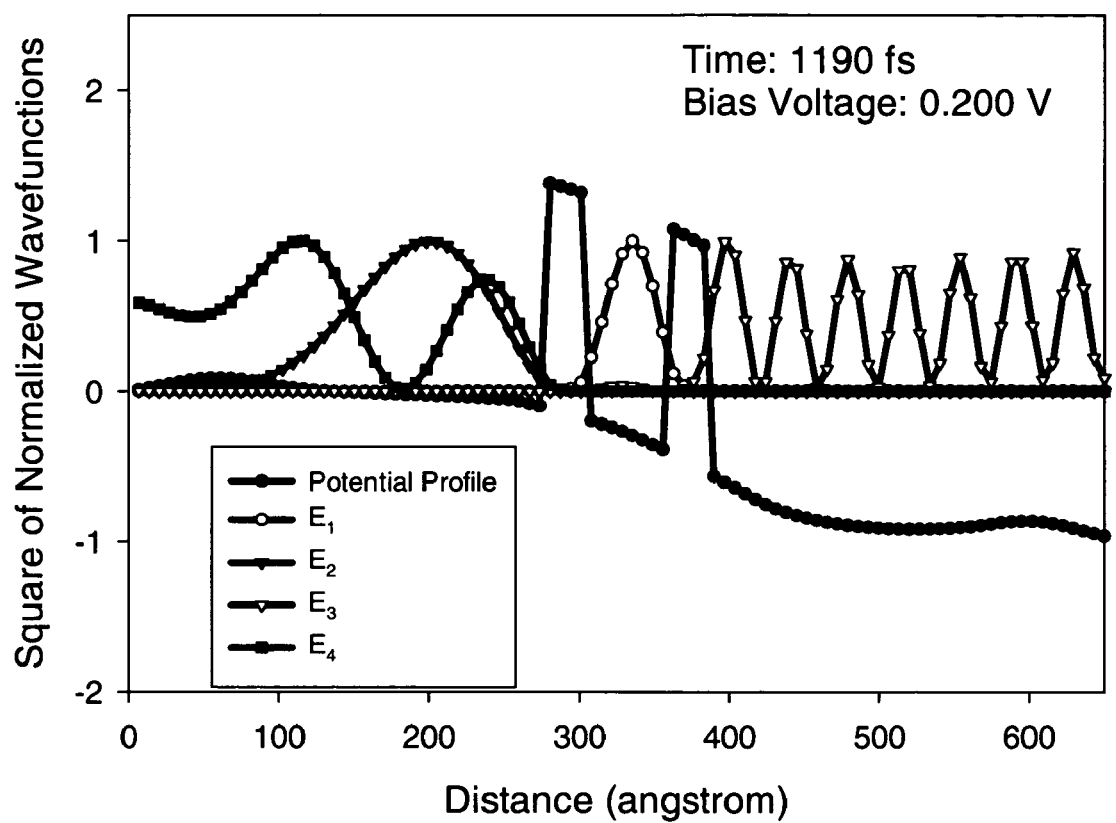
FIG. 8(b) is a graphical representation illustrating the square of normalized electron wavefunctions referenced to the potential energy profile at a bias voltage of 0.200V and at time 1190 fs according to the simulation studies of the invention.

Next, the results that correspond to applied biases below the BVW where oscillations are not present are described. FIG. 8(a) shows the time-independent energy-level structure reference to the device conduction-band (CB) profile and FIG. 8(b) gives the square of the wavefunctions within the DBQWS at a bias voltage of 0.2V and at a simulation time where steady state conditions have be reached (i.e., 1190 fs). Here the subband energy levels are referenced to the energy at the emitter boundary. Since there is only one quasi-bound energy level (i.e., $E_1<0$) and no EQW then there is no possibility for subband coupling between two quantum wells. Hence, this subband structure does not meet any of the oscillation criterions as previously derived. In addition, these results are consistent with the results of FIG. 2, which shows no oscillations at a bias voltage of 0.2V.

Figure 9A:
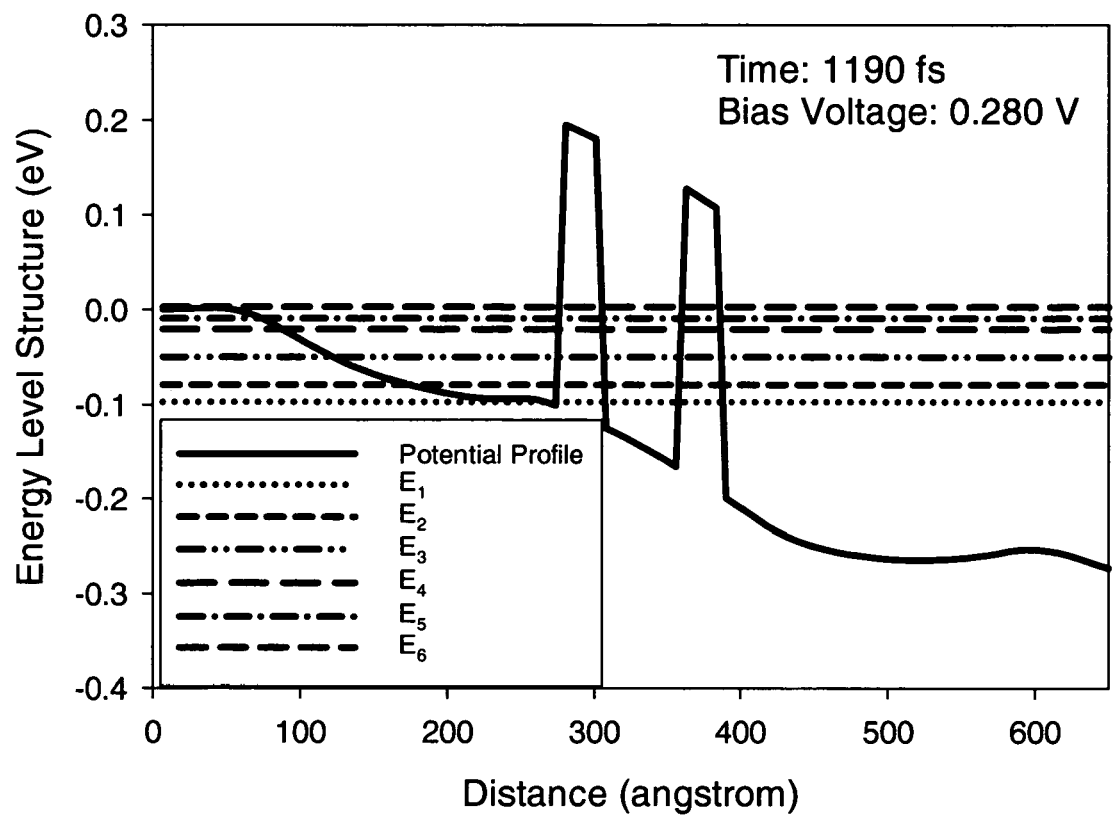
FIG. 9(a) is a graphical representation illustrating the energy subband structure referenced to the potential energy profile at a bias voltage of 0.280V and at time 1190 fs according to the simulation studies of the invention.
Figure 9B:
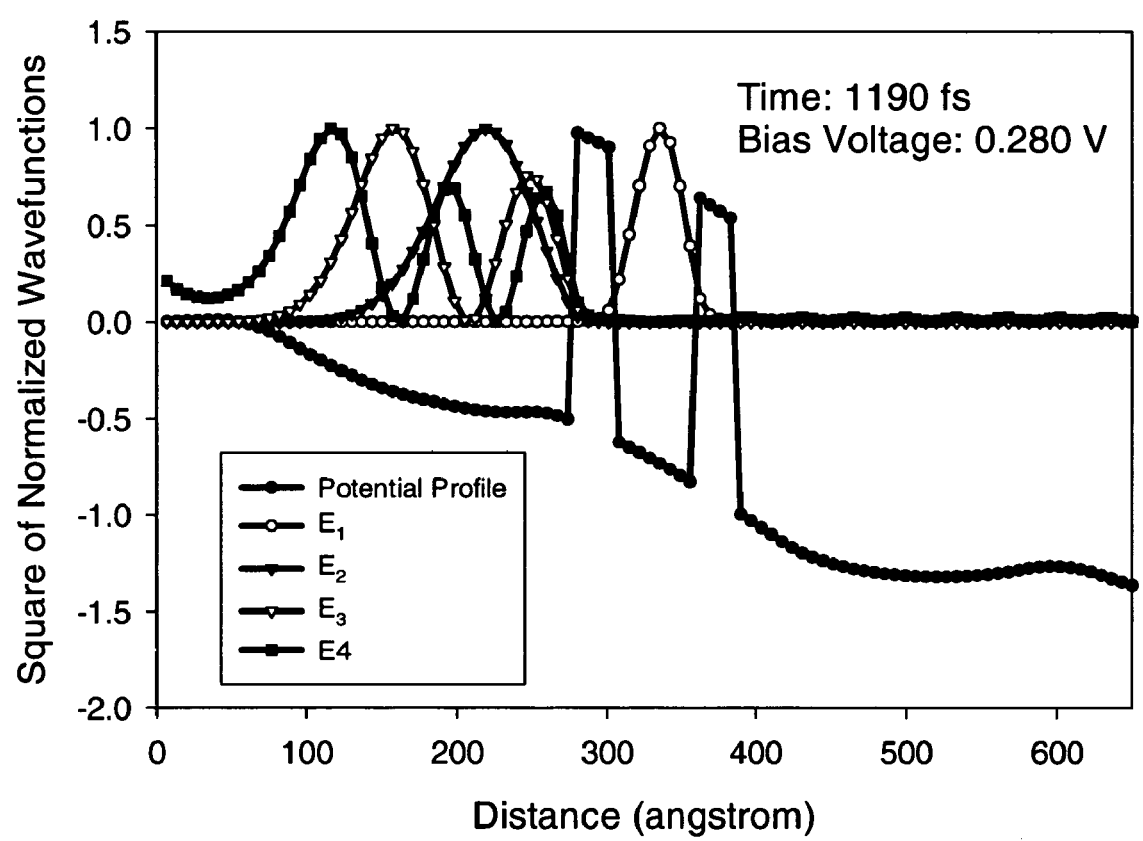
FIG. 9(b) is a graphical representation illustrating the square of normalized electron wavefunctions referenced to the potential energy profile at a bias voltage of 0.280V and at time 1190 fs according to the simulation studies of the invention.

Results that correspond to applied biases above the BVW where oscillations are also not predicted by the Wigner-Poisson model are illustrated in FIG. 9, which shows the time-independent energy-level structure (again referenced to the device CB profile) and the square of the wavefunctions within the DBQWS at a bias voltage of 0.280V and simulation time of 1190 fs. Here, it is seen that an EQW has formed due to the presence of significant reflection from the first barrier. In this particular case, there are multiple pairs of quasi-bound energy levels that have the potential to couple the EQW to the MQW. Hence, these levels have the potential to induce an intrinsic oscillation at a number of frequencies defined by the energy-level separation. However, a closer inspection reveals hat this subband structure does not meet the earlier defined criterion. First, the highest subbands (i.e., $E_4$, $E_5$, and $E_6$) are very closely spaced (i.e., less than 10 meV) and would not be resolvable if dissipation were included into the subband calculation. Furthermore, these highest levels are in the continuum and do not strongly couple the individual wells. Second, while each of the remaining subband pairs (here, the strongest interband contribution would be from those that are nearest to each other in energy) have the potential for inducing at instability, they do so at frequencies that are relatively close (i.e., ~50% difference). Hence, the generation of a net oscillation of significant amplitude requires that the various components are not of random phase. Direct calculations of the coefficients (i.e., F and G) for the subband oscillation models previously derived indicate that the contributions from the quasi-bound energy levels (i.e., $E_1$, $E_2$, $E_3$, and $E_4$) have random relative phases. Hence, the subband instability criterion is not met and the model predicts no oscillations in agreement with the Wigner-Possion simulations.

Figure 10A:
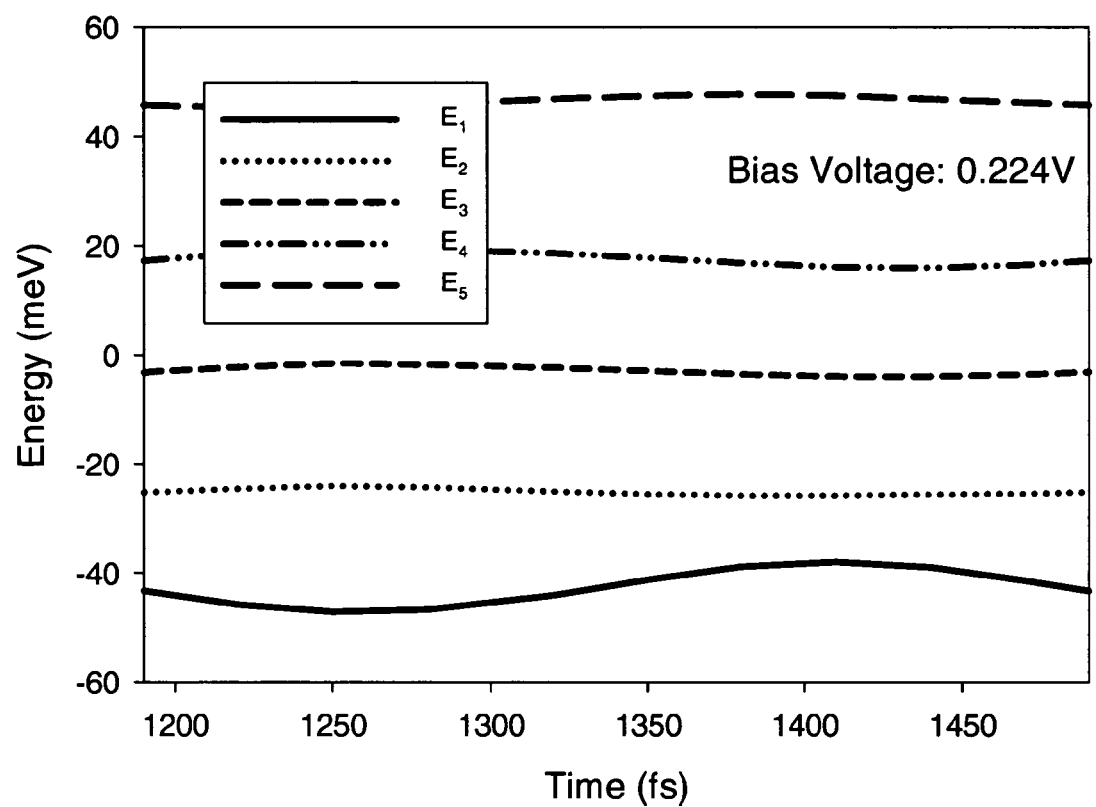
FIG. 10(a) is a graphical representation illustrating the time evolution of the energy subband structure at a bias voltage of 0.224V according to the simulation studies of the invention.
Figure 10B:
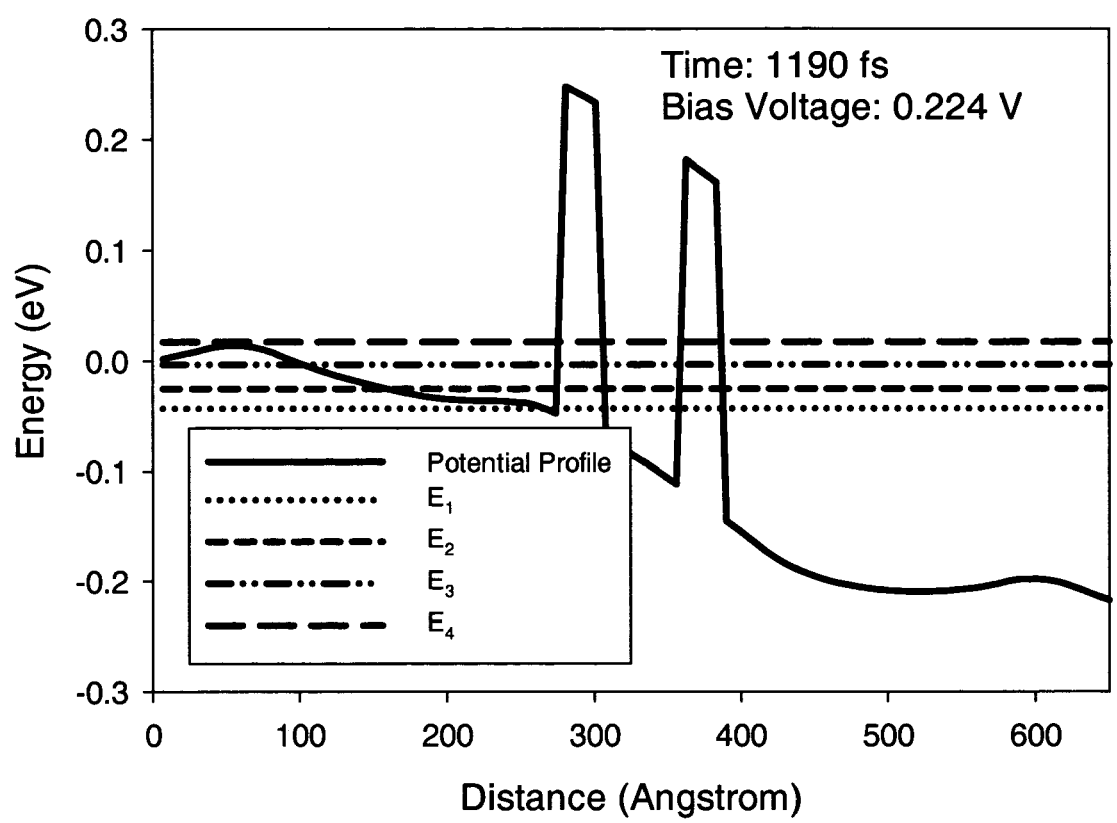
FIG. 10(b) is a graphical representation illustrating the energy subband structure referenced to the potential energy profile at a bias voltage of 0.224V according to the simulation studies of the invention.
Figure 10C:
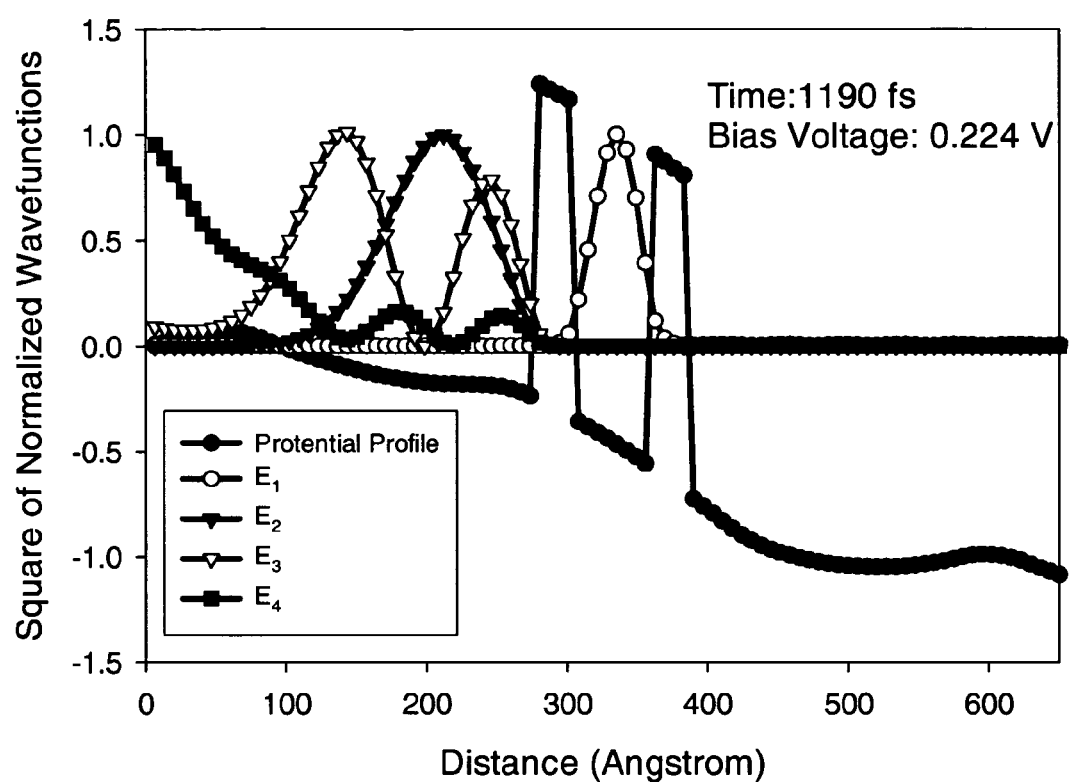
FIG. 10(c) is a graphical representation illustrating the square of normalized electron wavefunctions referenced to the potential energy profile at a bias voltage of 0.224V and at time 1190 fs according to the simulation studies of the invention.

Finally, a simulation is considered for the structure subject to a bias that induces oscillations. FIG. 10(a) shows the time-dependent energy-level structure derived from the subband model for a bias voltage of 0.224V. FIG. 10(b) gives the energy-level structure (again referenced to the device CB profile) and FIG. 10(c) gives the square of the wavefunctions of the DBQWS. Results in FIGS. 10(b) and 10(c) are for a bias voltage of 0.224V and are at a simulation time of 800 fs. From FIG. 10(b) one can see that there are only two energy levels that strongly couple the EQW to the MQW (i.e., as $E_3$ and $E_4$ both have energies above the emitter injection energy and therefore lie in the continuum). Thus, the main contribution to the intrinsic oscillation is from the lowest subband pair. Hence, this case corresponds to that of minimum subband coherence previously discussed. In this case, the wavefunctions that contribute to oscillation can be written as:

$$\psi(z, t) = \psi_1(z, t) e^{-i\frac{F_1}{\hbar}} + \psi_2(z, t) e^{-i\frac{F_2}{\hbar}} \quad (62)$$

where $$F_i(t) = \int_0^t dt' E_i(t')$$

is the energy of the ith energy level.

The relationship between the oscillation frequency and the energy level structure can be derived from FIG. 10(a) where there is only a significant time-dependency in $E_1$. The general form for the relationship for a subband pair (e.g., $E_2 - E_1$) is given in Equation (20). The cycle of variation in time for $E_1$ is identical to the current-density period of oscillation (see FIG. 2). The cycle of variation for the subband pair, $\Delta E = E_2 - E_1$, is given in FIG. 10(d). The subband energy difference varies periodically and can be written as:

$$\Delta E(t) = \Delta E_0 + E_m \sin(\omega_E t + \alpha) \quad (63)$$

where $E_m$ is the amplitude of the energy difference oscillation, $\omega_E$ is the oscillation frequency and the phase is given by:

$$\alpha(T_E) = \sin^{-1}\left[\frac{\Delta E(t_0) - \Delta E_0}{E_m}\right] - \frac{2\pi}{T_E} t_0 \quad (64)$$

where $$T_E = \frac{2\pi}{\omega}$$

where is the period of oscillation of the subband pair.

Again, considering the expression for the time-dependent electron density given in Equation (19), the phase of the electron density can be defined as $$\phi(t) = \frac{\Delta F(t)}{\hbar} + \beta(t),$$

where $\beta(t)$ has been introduced to account for phase-change due to the product of the subband wavefunctions given in Equation (14). The difference in phase for the electron density, at any two arbitrary times, $t_1$ and $t_2$, may now be written as:

$$\Delta\phi(t_1, t_2) = \frac{1}{\hbar}\left[\int_0^{t_2} dt' \Delta E(t') - \int_0^{t_1} dt' \Delta E(t')\right] \quad (65)$$
$$= \frac{1}{\hbar} \int_{t_1}^{t_2} dt' \Delta E(t')$$
$$= \frac{1}{\hbar}\left[\Delta E_0(t_2 t_1) + \int_{t_1}^{t_2} dt' E_m \sin(\omega_E t' + \alpha)\right] +$$
$$\beta(t_2) - \beta(t_1)$$

where Equation (63) has been used for the derivation. The period of oscillation of the electron density can now be defined by $T_p = t_b - t_a$ such that $\Delta\phi(t_a, t_b) = 2\pi$. The period of oscillation for the current density (and equivalently the electron density) at any spatial point is exactly equal to the period of oscillation for the subband energy difference. Since $T_p = T_E$, it follows that $$\int_{t_a}^{t_b} dt' \sin(\omega_E t' + \alpha) = \int_0^{T_E} dt' \sin(\omega_E t' + \alpha) = 0.$$

Figure 10D:
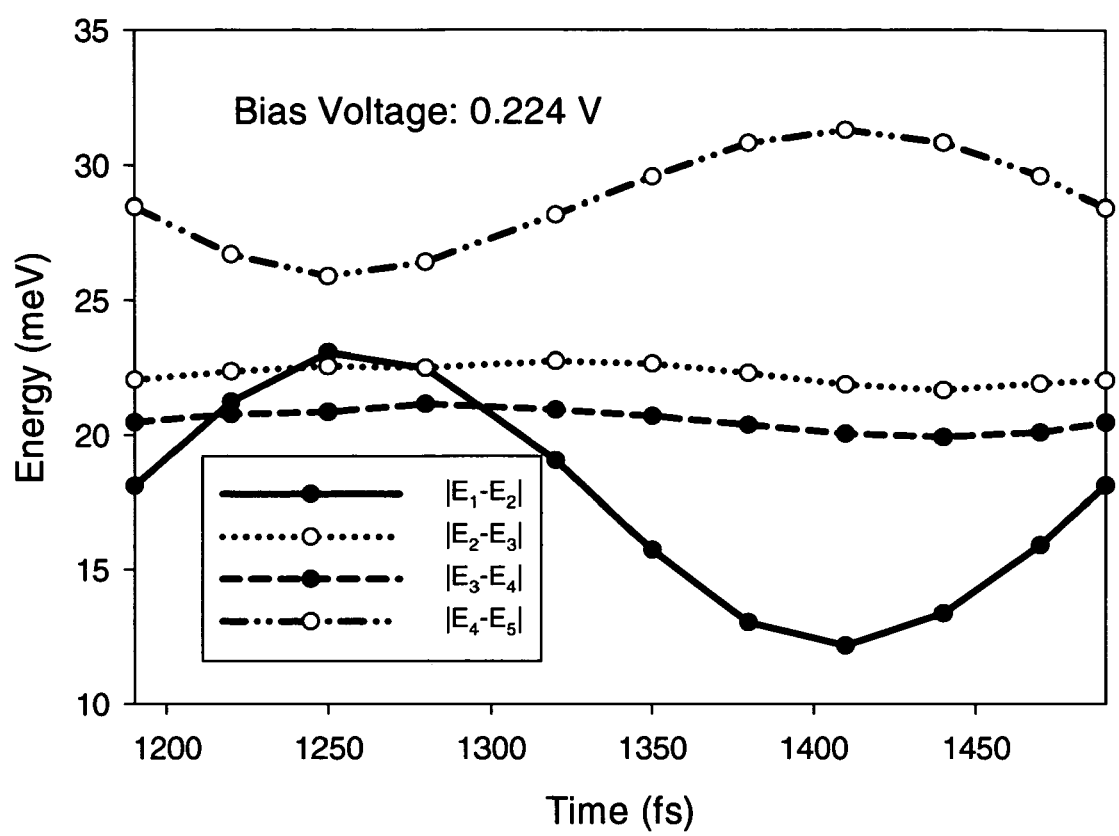
FIG. 10(d) is a graphical representation illustrating the time evolution of the subband energy differences at a bias voltage of 0.224V according to the simulation studies of the invention.

Therefore, evaluation of Equation (65) over the time period $t_b - t_a$ yields the relation:

$$T_\rho = T_E = \frac{\hbar}{\Delta E_0} \quad (66)$$

for defining the period (and frequency) of the intrinsic oscillation. FIG. 10(d) can be used to define the average energy difference of $\Delta E_0 = 18.1$ meV. Equation (66) now predicts an intrinsic oscillation frequency of:

$$v = \frac{1}{T_\rho} = 4.35 THz \quad (67)$$

The oscillation frequency for current density obtained from the Wigner-Poisson model was found to be 3.33 THz (i.e., see FIG. 2). Hence, the simple energy-subband description predicts an oscillation frequency within thirty percent of that obtained using the more complex (and physically complete) simulation model. This small error is very understandable in light of some of the assumptions utilized in deriving the subband energy structure (e.g., no reflection at the emitter boundary and no dissipation). Indeed, the assumption of no reflection at the input boundary of the device will slightly overestimate the number of electrons in the EQW and lead to an overestimation of the energy difference between the energy levels in the DBQWS. As the subband model given in Equation (66) is very sensitive to changes in the energy difference (i.e., a $\Delta E = 4.135$ meV means a 1 THz change in the frequency) this estimation for intrinsic oscillation frequency is very good. Furthermore, these results verify that the energy-subband structure is the key underlying mechanism for inducing the instability. Lastly, the previously developed model provides for basic insight into the phenomenon and offers guidance for defining new structures that will admit enhanced oscillation characteristics.

The invention provides a technique describing the origin of the intrinsic oscillations in a double-barrier quantum-well system (DBQWS). Furthermore, a derivation based upon an approximate subband model for the quantum system has been utilized to derive a simple relationship between the oscillation frequency and the energy level structure. The invention shows that the quantum mechanical coupling between the emitter quantum-well (EWQ) and the main quantum-well (MQW) is the root cause of the instability and self-oscillations of the electron density and electron current. Furthermore, the intrinsic oscillations arise directly as a result of the coupling between the energy subbands. Here, the main drivers of the process are the in-phase fluctuations of potential energy within the EQW and MQW that arise out of the subband coupling. Therefore, the instability is a purely quantum mechanical phenomenon with the frequency of oscillation determined by the average energy-difference of the quasi-discrete subband pairs that contribute (e.g., for minimum subband coherence $$v = \frac{\Delta E_0}{\hbar}).$$

These studies establish the fundamental principles for the intrinsic oscillation mechanisms. Most importantly, these studies also provide explicit guidance for defining new structures that will admit enhanced oscillation characteristics at operation frequencies within the terahertz regime.

Any practical implementation of a quantum-mechanical based intrinsic oscillator device towards the implementation of a very high frequency source will require an analysis of the basic device with the embedding circuit. However, these fundamental studies provide important information regarding the design of the resonant tunneling structures that have the capacity for admitting the necessary instability properties. The invention provides a Wigner-Poisson simulation tool for identifying the occurrence of intrinsic oscillations and develops a simplified subband model for interrogating the energy state structure.

Figure 11A:
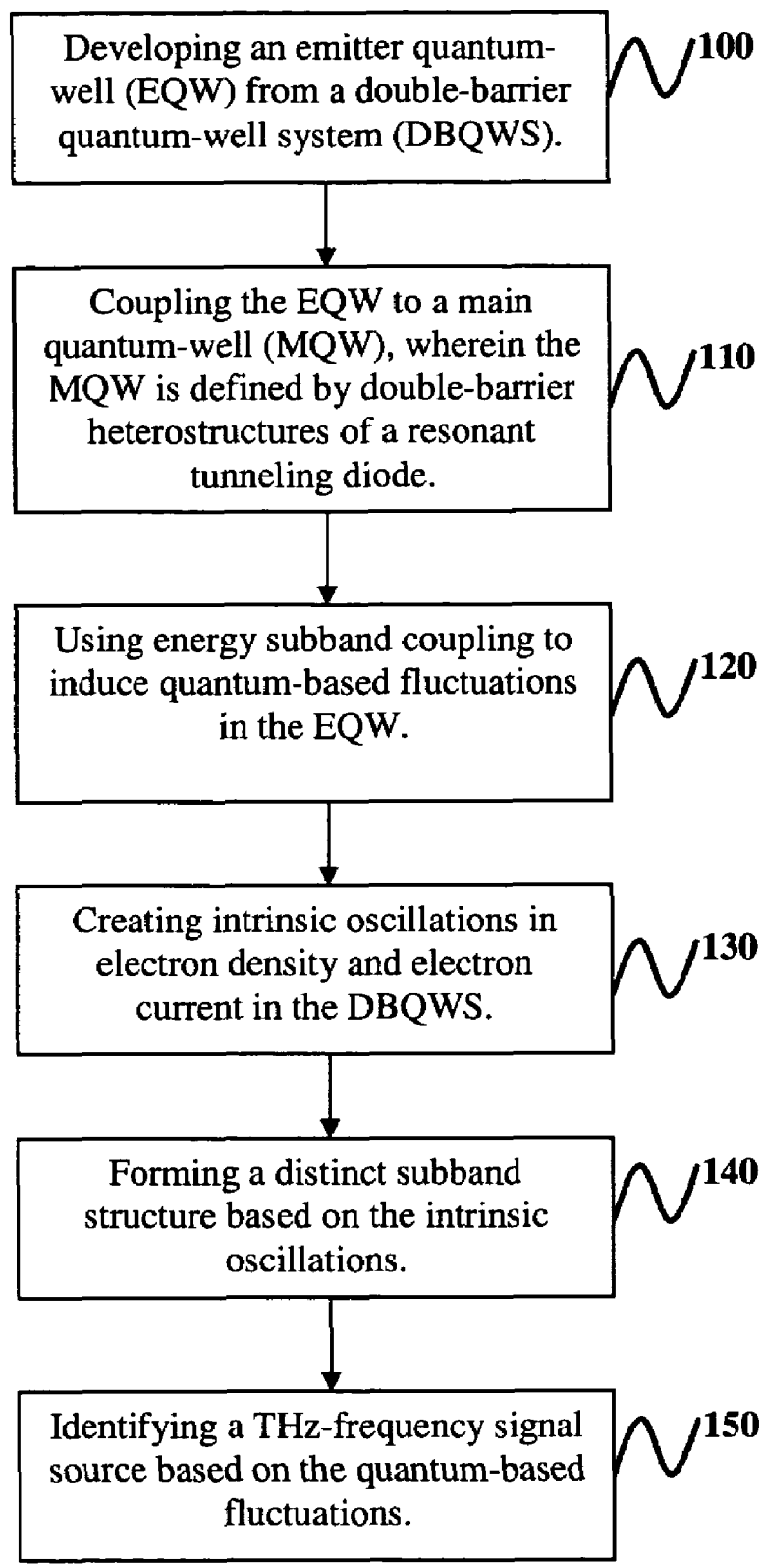
FIG. 11(a) is a flow diagram illustrating a method of the invention.

As illustrated in the flow diagram of FIG. 11(a), an embodiment of the invention provides a method of determining causes of intrinsic oscillations in a double-barrier quantum-well intrinsic oscillator, wherein the method comprises developing 100 an emitter quantum-well (EQW) from a double-barrier quantum-well system (DBQWS); coupling 110 the EQW to a main quantum-well (MQW), wherein the MQW is defined by double-barrier heterostructures of a resonant tunneling diode; using 120 energy subband coupling to induce quantum-based fluctuations in the EQW; creating 130 intrinsic oscillations in electron density and electron current in the DBQWS; forming 140 a distinct subband structure based on the intrinsic oscillations; and identifying 150 a THz-frequency signal source based on the quantum-based fluctuations, wherein the intrinsic oscillations comprise maximum subband coherence, partial subband coherence, and minimum subband coherence, wherein the energy subband is a quantum mechanical energy subband, wherein the intrinsic oscillations occur proximate to a bias voltage point in the range of 0.224V and 0.280V, and wherein current oscillations are stable proximate to the bias voltage point.

Figure 11B:
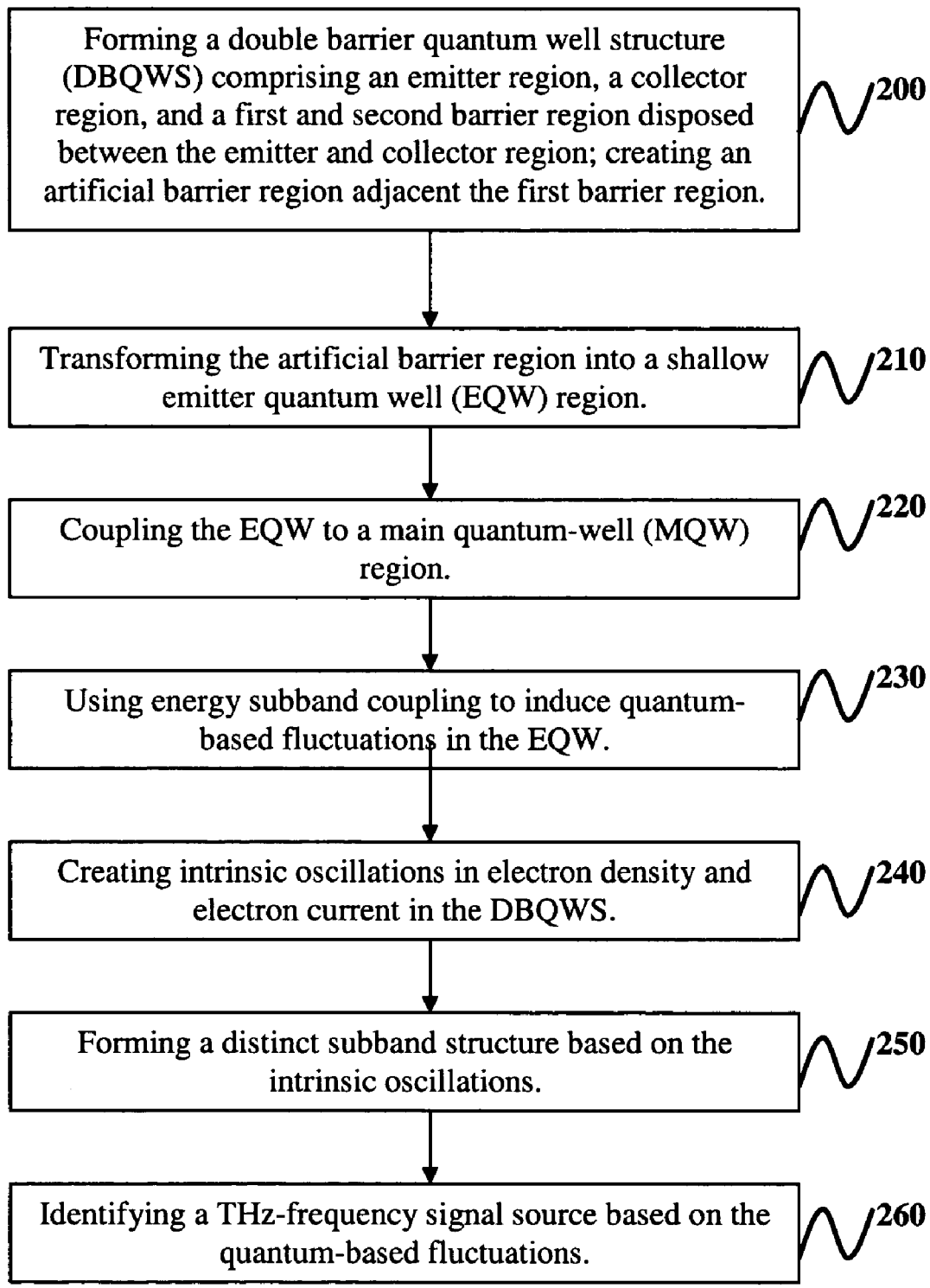
FIG. 11(b) is a flow diagram illustrating a method of the invention.

In another embodiment illustrated in FIG. 11(b), the invention provides a method of enhancing a semiconductor-based signal source, wherein the method comprises forming 200 a double barrier quantum well structure (DBQWS) comprising an emitter region, a collector region, and a first and second barrier region disposed between the emitter and collector region; creating an artificial barrier region adjacent the first barrier region; transforming 210 the artificial barrier region into a shallow emitter quantum well (EQW) region; coupling 220 the EQW to a main quantum-well (MQW) region; using 230 energy subband coupling to induce quantum-based fluctuations in the EQW; creating 240 intrinsic oscillations in electron density and electron current in the DBQWS; forming 250 a distinct subband structure based on the intrinsic oscillations; and identifying 260 a THz-frequency signal source based on the quantum-based fluctuations.

Figure 11C:
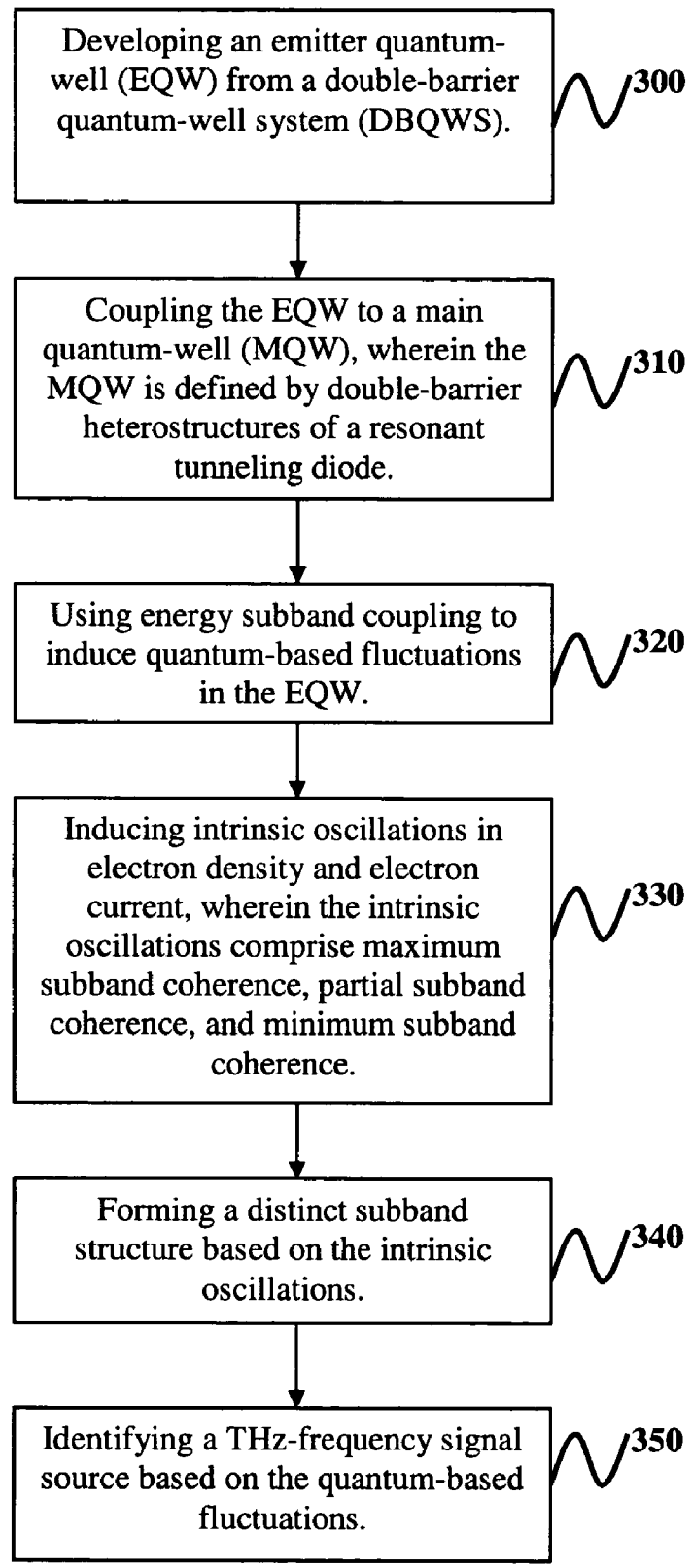
FIG. 11(c) is a flow diagram illustrating a method of the invention.

In yet another embodiment illustrated in FIG. 11(c), the invention provides a method of designing a double-barrier quantum-well intrinsic oscillator, wherein the method comprises developing 300 an emitter quantum-well (EQW) from a double-barrier quantum-well system (DBQWS); coupling 310 the EQW to a main quantum-well (MQW), wherein the MQW is defined by double-barrier heterostructures of a resonant tunneling diode in the DBQWS; using 320 energy subband coupling to induce quantum-based fluctuations in the EQW; inducing 330 intrinsic oscillations in electron density and electron current, wherein the intrinsic oscillations comprise maximum subband coherence, partial subband coherence, and minimum subband coherence; forming 340 a distinct subband structure based on the intrinsic oscillations; and identifying 350 a THz-frequency signal source based on the quantum-based fluctuations.

Essentially, according to the invention, for certain applied biases the DBQWS develop an EQW that couples to the MQW defined by the double-barrier heterostructures of the resonant tunneling diode. The subband coupling then induces quantum-based fluctuations in the potential energy profile that leads to intrinsic oscillations in electron density and electron current. As these oscillations are critically dependent on the coupling of the quasi-discrete energy levels, the intrinsic oscillations will only occur at sufficiently low temperatures (e.g., 77 K) that allow for the formation of a distinct subband structure (minimum energy broadening effects). Hence, depending on the operation temperature selected, an adequate level of resolvability within the subband structure should be established to enable the instability mechanism.

Moreover, the demonstration of the subband-coupling as the underlying catalyst for the intrinsic instability immediately provides guidance for alternative heterostructure systems that provide superior oscillation performance. For example, in the DBQWS under study the subband coupling develops between the MQW, which always exists, and the EQW that forms only at certain biases due to interference effects arising out of quantum reflections from the first heterostructure barrier. An alternative approach for realizing intrinsic oscillations is to utilize a double-well system constructed from a triple-barrier heterostructure system. This approach provides more latitude in biasing the device in that oscillations are produced over a wider range of applied bias. There is also the possibility that multiple double-well systems may be combined to realize larger oscillation amplitudes. Also, as the fundamental driver of the instability is the subband coupling, it is certainly possible to envision single well systems that yield coupled subbands (e.g., parabolic wells) with the potential for producing intrinsic oscillations. Finally, as was directly demonstrated by the studies implementing the invention, it is possible to utilize well engineering to modify the shape of the quantum wells and to enhance the amplitude of the observed current density oscillation.

Additionally, as the subband-coupling has been shown to produce the instability, it should be possible to design structures that yield enhanced oscillation amplitudes through engineering of the energy-level separations and the associated phase of the quantum mechanical scattering-state functions. Specifically, the invention has demonstrated that the oscillation is a product of individual subband-pair coupling. In particular, results from the simulation studies demonstrate a case of minimum subband-coherence where only one pair of energy states contributed to the oscillation. Hence, if tunneling structures were designed such that partial or maximum subband-coherence was achieved then the amplitude of the current oscillation should be enhanced. This would specifically entail the design of structures that resulted in equal energy state spacing and coherent superposition in the corresponding wavefunction inner products.

The invention prescribes an approach for the design and development of a semiconductor-based signal source at very high frequencies (i.e., approximately 300 GHz to 5 THz). The invention provides a design criterion, which provides for the following advantages. A key advantage of the technique provided by the invention is that one can induce intrinsic oscillations through the clever design of double-barrier quantum-well structures. An oscillator source that utilizes intrinsic oscillations has the potential for reaching very high operation frequencies in the range above 300 GHz to about 5 THz. Here, the intrinsic oscillation phenomenon is facilitated through quantum fluctuations induced by quantum mechanical subband coupling mechanisms. The invention also provides guidance for utilizing alternative nanoscale structures and band-structure engineering for realizing enhanced oscillation amplitudes. This translates directly into high levels of output power.

The invention also discloses fundamental physical concepts related to the quantum mechanical principles of instability. Here, the invention provides a solution of how to engineer the quantum mechanical energy levels and envelope functions such that one can achieve enhancement to the oscillation amplitudes. This also translates directly into high levels of output power.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

APPENDIX

This appendix briefly presents the procedure used for calculating the relaxation time used in the simulation studies. According to the fundamental scattering theory, the scattering rate W(k) is written as:

$$W(k) = \frac{2\pi}{\hbar} \frac{\Omega}{(2\pi)^3} \int dk' |<k'|H'|k>|^2 \delta(E_{k'} - E_k \pm \hbar\omega) \quad (A1)$$

where the expressions of the interaction Hamiltonian H' for various interactions are known[27, 29]. The momentum relaxation time can be related to the scattering rate in terms of the formula $W(k)=1/\tau(k)$. The total effect of the interactions on the relaxation time can be expressed by using Matthiessen's rule; i.e., $$1/\tau = \sum 1/\tau_i,$$

where $1/\tau_i$ is the scattering rate caused by the ith interaction. Moreover, $\tau(k)$ is related to the energy of the electrons. The total relaxation time $\tau_i$ for each process can be obtained from the momentum relaxation time $\tau_i(k)$ by:

$$\tau_i = \frac{1}{\Gamma 5/2} \int_0^\infty x^{3/2} \tau_i(x) \exp(-x) dx \quad (A2)$$

where $\Gamma$ is the gamma function and $x=\rho E_k$. In deriving the above equation, it is assumed that the electron energy is parabolic in momentum.

REFERENCES

[1] Tredicucci, A. et al., "Continuous wave operation of long wavelength (λ≅11 µm) inter-miniband lasers," Electronics Letters, Vol. 36, No. 10, May 11, 2000, pp. 876–878; (see also Capasso, F. et al., "High Speed Heterostructure Device," Academic Press, Inc., 1994; Chamberlain, J. M. et al., "New Directions in Terahertz Technology," Aluwer Academic Publishers, 1997).

[2] Sollner, T. C. L. G. et al., "Observation of millimeter-wave oscillations from resonant tunneling diodes and some theoretical considerations of ultimate frequency limits," Appl. Phys. Lett., Vol. 50, No. 6, Feb. 9, 1987, pp. 332–334; (see also Brown, E. R., "Hot Carriers in Semiconductor Nanostructures," Academic Press, 1992, pp. 469; Lheurette, E. et al., "$In_{0.1}Ga_{0.9}As/GaAs/AlAs$ Pseudomorphic Resonant Tunnelling Diodes Integrated With Airbridge," Electronics Letters, Vol. 28, No. 10, May 7, 1992, pp. 937–938).

[3] Woolard, D. L. et al., "Intrinsic Oscillations in Resonant Tunneling Structures," 53$^{rd}$ Annual Device Research Conference Digest 1995, pp. 54–55.

[4] Woolard, D. L. et al., "An Assessment of Potential Nonlinear Circuit Models for the Characterization of Resonant Tunneling Diodes," IEEE Transactions on Electron Devices, Vol. 43, No. 2, February 1996, pp. 332–341.

[5] Boric-Lubecke, O. et al., "Fundamental and Subharmonic Excitation for an Oscillator with Several Tunneling Diodes in Series," IEEE Transactions on Microwave Theory and Techniques, Vol. 43 No. 4, April 1995, pp. 969–976.

[6] Kidner, C. et al., "Power and Stability Limitations of Resonant Tunneling Diodes," IEEE Transactions on Microwave Theory and Techniques, Vol. 38 No. 7, July 1990, pp. 864–872.

[7] Zhao, P. et al., "Operation Principle of Resonant Tunneling THz Oscillator at Fixed Bias Voltages," VLSI Design, Vol. 00, No. 00, 2001, pp. 1–5.

[8] Ricco, B. et al., "Physics of resonant tunneling. The one-dimensional double-barrier case," Physcial Review B, Vol. 29, No. 4, Feb. 15, 1984, pp. 1970–1981.

[9] Buot, F. A. et al., "Lattice Weyl-Wigner formulation of exact many-body quantum-transport theory and applications to novel solid-state quantum-based devices," Physical Review B, Vol. 42, No. 15, Nov. 15, 1990, pp. 9429–9438.

[10] Zhao, P. et al., "Quantum transport equations for single-band and multi-band semiconductors. I. Formaulation," Philosophical Magazine B, Vol. 80, No. 7, 2000, pp. 1359–1392.

[11] Bordone, P. et al., "Quantum transport of electrons in open nanostructures with the Wigner-function formalism," Physical Review B, Vol. 59, No. 4, Jan. 15, 1999, pp. 3060–3069.

[12] Jensen, K. L. et al., "Numerical Simulation of Intrinsic Bistability and High-Frequency Current Oscillations in Resonant Tunneling Structures," Physical Review Letters, Vol. 66, No. 8, Feb. 25, 1991, pp. 1078–1081.

[13] Schomburg, E. et al., "InGaAs/InAlAs superlattice oscillator at 147 GHz," Electronics Letters, Vol. 35, No. 17, Aug. 19, 1999, pp. 1491–1492.

[14] Zhao, P. et al., "Simulation of resonant tunneling structures: Origin of the I-V hysteresis and plateau-like structure," Journal of Applied Physics, Vol. 87, No. 3, Feb. 1, 2000, pp. 1337–1349.

[15] Biegel, B. A. et al., "Comparison of self-consistency iteration options for the Wigner function method of quantum device simulation," Physical Review B, Vol. 54, No. 11, Sep. 15, 1996, pp. 8070–8082.

[16] Presilla, C. et al., "Nonlinear feedback oscillations in resonant tunneling through double barriers," Physical Review B, Vol. 43, No. 6, Feb. 15, 1991, pp. 5200–5203.

[17] Woolard, D. L. et al., "On the different physical roles of hysteresis and intrinsic oscillations in resonant tunneling structures," J. Appl. Phys., Vol. 79, No. 3, Feb. 1, 1996, pp. 1515–1525.

[18] Kluksdahl, N. C. et al., "Self-consistent study of the resonant-tunneling diode," Physical Review B, Vol. 39, No. 11, Apr. 15, 1989, pp. 7720–7735.

[19] Frensley, W., "Boundary conditions for open quantum systems driven far from equilibrium," Reviews of modern Physics, Vol. 62, No. 3, July 1990, pp. 745–791.

[20] Goldman, V. J. et al., "Observation of Intrinsic Bistability in Resonant-Tunneling Structures," Physical Review Letters, Vol. 58, No. 12, Mar. 23, 1987, pp. 1256–1259.

[21] Sollner, T. C. L. G., "Comment on Observation of Intrinsic Bistability in Resonant-Tunneling Structures," Physical Review Letters, Vol. 59, No. 14, Oct. 5, 1987, pp. 1622.

[22] Wigner, E., "On the Quantum Correction For Thermodynamic Equilibrium," Physical Review, Vol. 40, Jun. 1, 1932, pp. 749–759.

[23] Zhao, P. et al., "Dynamical instabilities and I-V characteristics in resonant tunneling through double-barrier quantum well systems," Physical Review B, Vol. 63, No. 7, Jan. 18, 2001, pp. 1–14.

[24] Woolard, D. L. et al., "THz-frequency intrinsic oscillations in double-barrier quantum well systems," Physica B, 314, 2002, pp. 108–112.

[25] Lent, C. S. et al., "The quantum transmitting boundary method," J. Appl. Phys., Vol. 67, No. 10, May 15, 1990, pp. 6353-6359.

[26] Frensley, W., "Numerical Evaluation of Resonant States," Superlattices and Microstructures, Vol. 11, No. 3, 1992, pp. 347–350.

[27] Liu, Y. X. et al., "Efficient, numerically stable multiband k•p treatment of quantum transport in semiconductor heterostructures," Physical Review B, Vol. 54, No. 8, Aug. 15, 1996, pp. 5675–5683.

[28] Tomizawa, K., "Numberical Simulation of Submicron Semiconducto Devices," Artech House, 1993.

[29] Ridley, B. K., "Quantum Process in Semiconductors $2^{nd}$ Ed.," Oxford University, 1988.

[30] Nag, B. R., "Electron Transport in Compound Semiconductors," Springer, 1980.

[31] Eisele, H. et al., "Recent Advances in the Performance of InP Gunn Devices and GaAs TUNNETT Diodes for the 100–300-GHz Frequency Range and Above," IEEE Transactions on Microwave Theory and Techniques, Vol. 48, No. 4, April 2000, pp. 626 –631.

What is claimed is:

1. A method of determining causes of intrinsic oscillations in a double-barrier quantum-well intrinsic oscillator, said method comprising:

developing an emitter quantum-well (EQW) from a double-barrier quantum-well system (DBQWS);

coupling said EQW to a main quantum-well (MQW), wherein said MQW is defined by double-barrier heterostructures of a resonant tunneling diode;

using energy subband coupling to induce quantum-based fluctuations in said EQW;

creating intrinsic oscillations in electron density and electron current in said DBQWS, and forming a distinct subband structure based on said intrinsic oscillations.

2. The method of claim 1, wherein said intrinsic oscillations comprise maximum subband coherence, partial subband coherence, and minimum subband coherence.

3. The method of claim 1, further comprising identifying a THz-frequency signal source based on said quantum-based fluctuations.

4. The method of claim 1, wherein said energy subband is a quantum mechanical energy subband.

5. The method of claim 1, wherein said intrinsic oscillations occur proximate to a bias voltage point.

6. The method of claim 5, wherein said bias voltage point is in the range of 0.224V and 0.280V.

7. The method of claim 5, wherein current oscillations are stable proximate to said bias voltage point.

8. A method of enhancing a semiconductor-based signal source, said method comprising:

forming a double barrier quantum well structure (DBQWS) comprising an emitter region, a collector region, and a first and second barrier region disposed between said emitter and collector region;

creating an artificial barrier region adjacent said first barrier region;

transforming said artificial barrier region into a shallow emitter quantum well (EQW) region;

coupling said EQW to a main quantum-well (MQW) region;

using energy subband coupling to induce quantum-based fluctuations in said EQW;

creating intrinsic oscillations in electron density and electron current in said DBQWS, and forming a distinct subband structure based on said intrinsic oscillations.

9. The method of claim 8, wherein said intrinsic oscillations comprise maximum subband coherence, partial subband coherence, and minimum subband coherence.

10. The method of claim 8, further comprising identifying a THz-frequency signal source based on said quantum-based fluctuations.

11. The method of claim 8, wherein said energy subband is a quantum mechanical energy subband.

12. The method of claim 8, wherein said intrinsic oscillations occur proximate to a bias voltage point.

13. The method of claim 12, wherein said bias voltage point is in the range of 0.224V and 0.280V.

14. The method of claim 12, wherein current oscillations are stable proximate to said bias voltage point.

15. A method of designing a double-barrier quantum-well intrinsic oscillator, said method comprising:
   developing an emitter quantum-well (EQW) from a double-barrier quantum-well system (DBQWS);
   coupling said EQW to a main quantum-well (MQW), wherein said MQW is defined by double-barrier heterostructures of a resonant tunneling diode in said DBQWS;
   using energy subband coupling to induce quantum-based fluctuations in said EQW;
   inducing intrinsic oscillations in electron density and electron current, wherein said intrinsic oscillations comprise maximum subband coherence, partial subband coherence, and minimum subband coherence; and
   forming a distinct subband structure based on said intrinsic oscillations.

16. The method of claim 15, further comprising identifying a THz-frequency signal source based on said quantum-based fluctuations.

17. The method of claim 15, wherein said energy subband is a quantum mechanical energy subband.

18. The method of claim 15, wherein said intrinsic oscillations occur proximate to a bias voltage point.

19. The method of claim 18, wherein said bias voltage point is in the range of 0.224V and 0.280V.

20. The method of claim 18, wherein current oscillations are stable proximate to said bias voltage point.

* * * * *